US009691884B2

(12) United States Patent
Makala et al.

(10) Patent No.: US 9,691,884 B2
(45) Date of Patent: Jun. 27, 2017

(54) MONOLITHIC THREE DIMENSIONAL NAND STRINGS AND METHODS OF FABRICATION THEREOF

(71) Applicant: SanDisk Technologies, Inc., Plano, TX (US)

(72) Inventors: Raghuveer S. Makala, Campbell, CA (US); Yanli Zhang, San Jose, CA (US); Rahul Sharangpani, Fremont, CA (US); Yao-Sheng Lee, Tampa, FL (US); Senaka Krishna Kanakamedala, Milpitas, CA (US); George Matamis, Danville, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/468,650

(22) Filed: Aug. 26, 2014

(65) Prior Publication Data
US 2016/0064532 A1    Mar. 3, 2016

(51) Int. Cl.
*H01L 29/66* (2006.01)
*H01L 27/115* (2017.01)
(Continued)

(52) U.S. Cl.
CPC .... *H01L 29/66825* (2013.01); *H01L 21/7682* (2013.01); *H01L 27/1157* (2013.01); *H01L 27/11524* (2013.01); *H01L 27/11556* (2013.01); *H01L 27/11582* (2013.01); *H01L 29/66833* (2013.01)

(58) Field of Classification Search
None
See application file for complete search history.

(56) References Cited

U.S. PATENT DOCUMENTS

| 5,563,105 A | 10/1996 | Dobusinsky et al. |
| 5,915,167 A | 6/1999 | Leedy |

(Continued)

OTHER PUBLICATIONS

Williams, et al. entitled "Etch Rates for Micromachining Processing-Part II", Journal of Microelectromechanical Systems, vol. 12, No. 6, Dec. 2003.*

(Continued)

*Primary Examiner* — Erik Kielin
(74) *Attorney, Agent, or Firm* — The Marbury Law Group PLLC

(57) ABSTRACT

Methods of making a monolithic three dimensional NAND string that include forming a stack of alternating first material layers and second material layers over a substrate, where each of the second material layers includes a layer of a first silicon oxide material between two layers of a second silicon oxide material different from the first silicon oxide material, etching the stack to form a front side opening in the stack, forming a memory film over a sidewall of the front side opening, and forming a semiconductor channel in the front side opening such that at least a portion of the memory film is located between the semiconductor channel and the sidewall of the front side opening, where at least one of an air gap or a material which has a dielectric constant below 3.9 is formed between the respective two layers of second silicon oxide material.

42 Claims, 15 Drawing Sheets

(51) Int. Cl.
    *H01L 21/768*     (2006.01)
    *H01L 27/11556*     (2017.01)
    *H01L 27/11582*     (2017.01)
    *H01L 27/11524*     (2017.01)
    *H01L 27/1157*     (2017.01)

(56) References Cited

U.S. PATENT DOCUMENTS

| | | | |
|---|---|---|---|
| 8,658,499 | B2 | 2/2014 | Makala et al. |
| 2007/0252201 | A1 | 11/2007 | Kito et al. |
| 2010/0112769 | A1 | 5/2010 | Son et al. |
| 2011/0298013 | A1* | 12/2011 | Hwang ............ H01L 27/11551 257/208 |
| 2012/0256247 | A1 | 10/2012 | Alsmeier |
| 2014/0080309 | A1* | 3/2014 | Park ................ H01J 37/32357 438/723 |
| 2014/0191312 | A1* | 7/2014 | Kim ..................... H01L 29/78 257/330 |
| 2014/0220750 | A1 | 8/2014 | Sohn et al. |
| 2014/0225181 | A1 | 8/2014 | Makala et al. |
| 2014/0332873 | A1* | 11/2014 | Yoo ................. H01L 27/11556 257/314 |
| 2015/0294980 | A1* | 10/2015 | Lee .................. H01L 27/11582 257/324 |
| 2015/0340274 | A1* | 11/2015 | Ryan ............... H01L 21/76224 438/424 |
| 2015/0364485 | A1* | 12/2015 | Shimura .......... H01L 27/11556 257/316 |

OTHER PUBLICATIONS

U.S. Appl. No. 62/011,421.*
Endoh, et al., "Novel Ultra High Density Memory with a Stacked-Surrounding Gate Transistor (S-SGT) Structured Cell," IEDM Proc. (2001) 33-36.
International Search Report and Written Opinion for PCT/US2015/046035, dated Mar. 17, 2016, 20 pages.
Invitation to Pay Additional Fees and Partial International Search Report for PCT/US2015/046035, dated Jan. 22, 2016, 9 pages.
Kang, D. et al., "Improving the Cell Characteristics Using Low-k Gate Spacer in 1Gb NAND Flash Memory," Electron Devices Meeting, IEDM '06 International, IEEE, pp. 1-4, (2006).
Non Final Office Action for a Corresponding U.S. Appl. No. 14/957,762, Office Action issued Jul. 8, 2016, 36pgs.
International Preliminary Report on Patentability and Written Opinion of the International Searching Authority for International Patent Application No. PCT/US2015/046035, mailed Mar. 9, 2017, 14 pages.

* cited by examiner

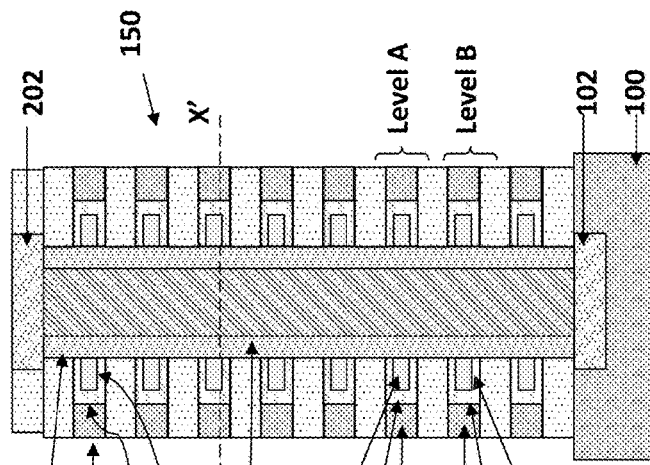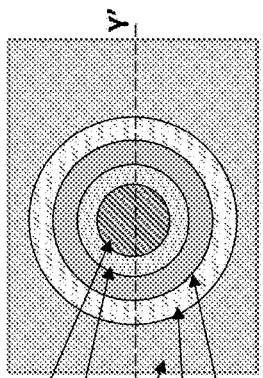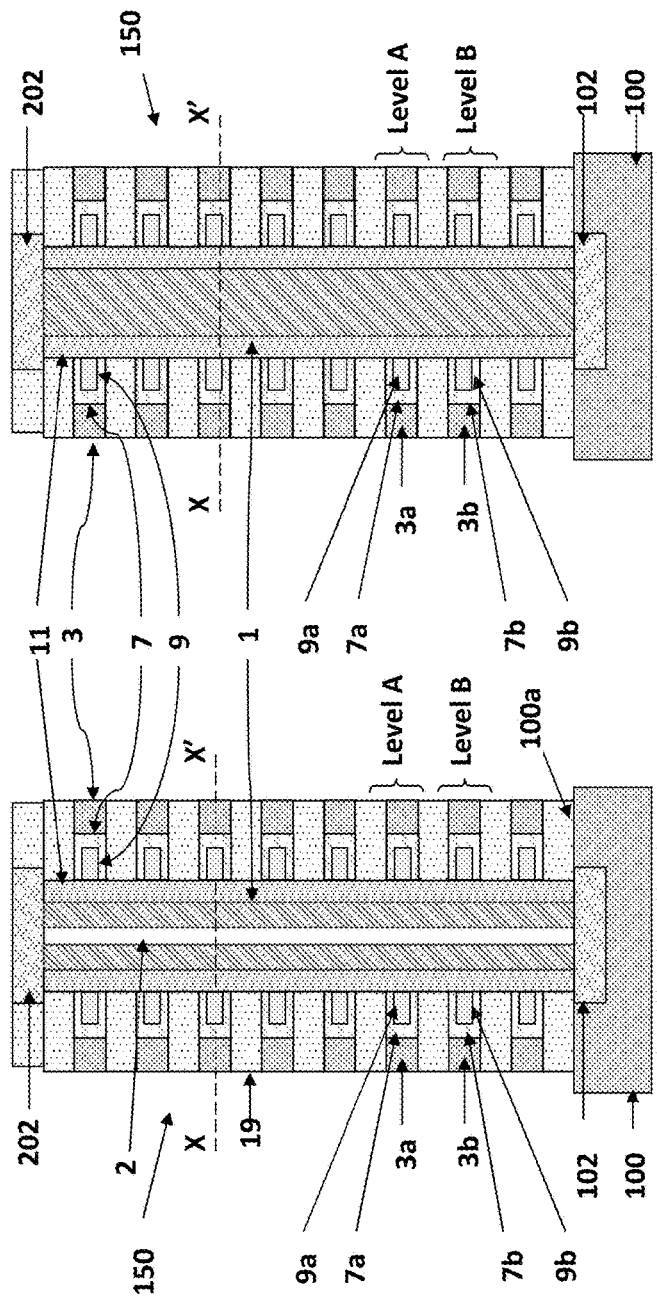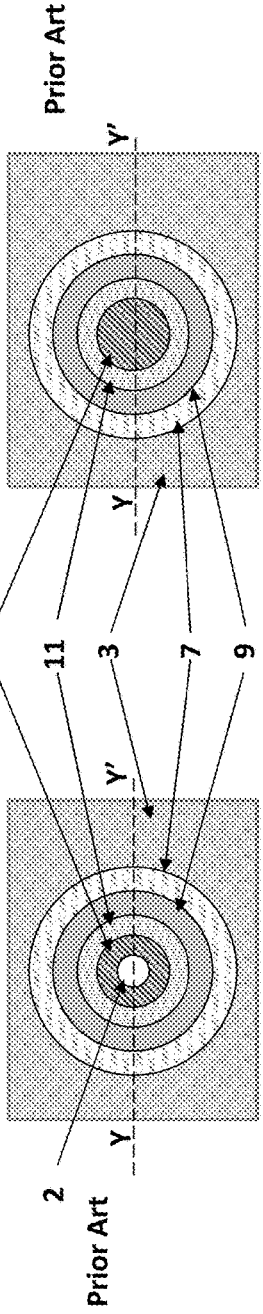

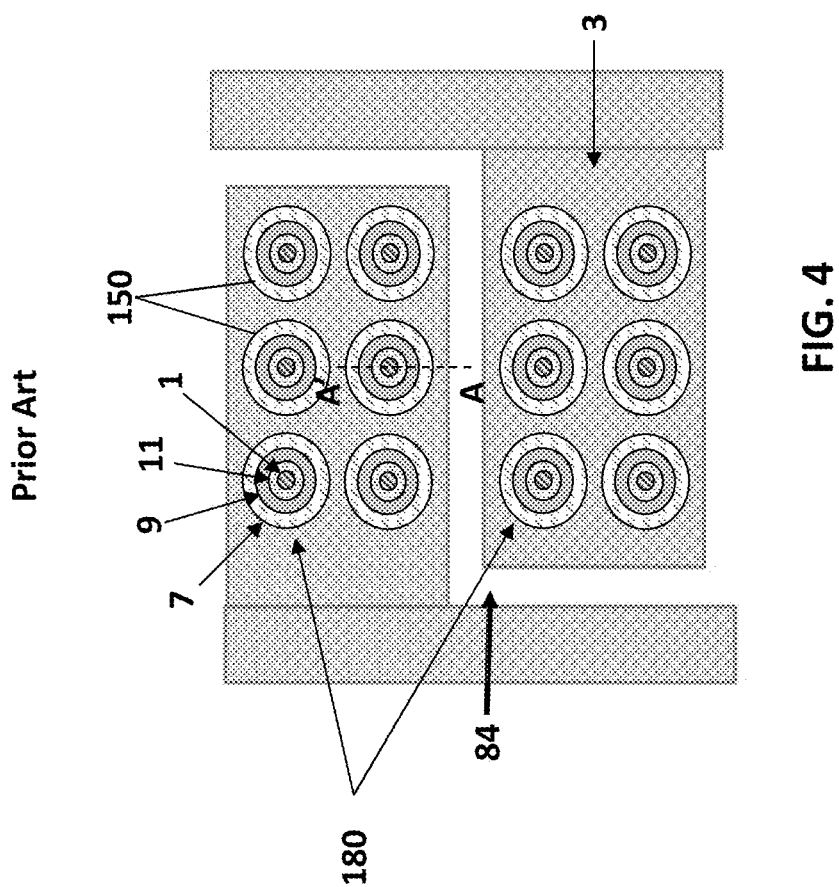

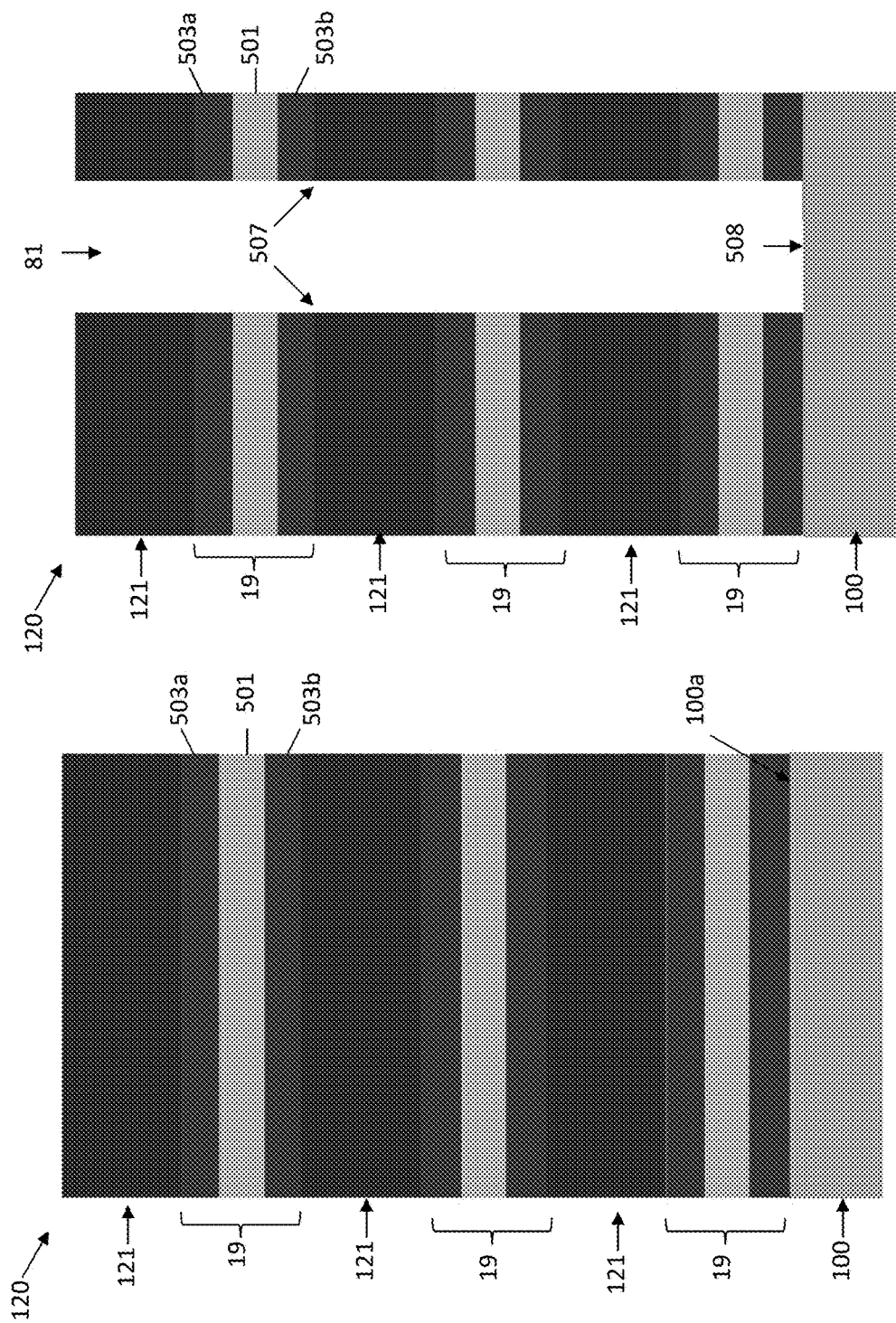

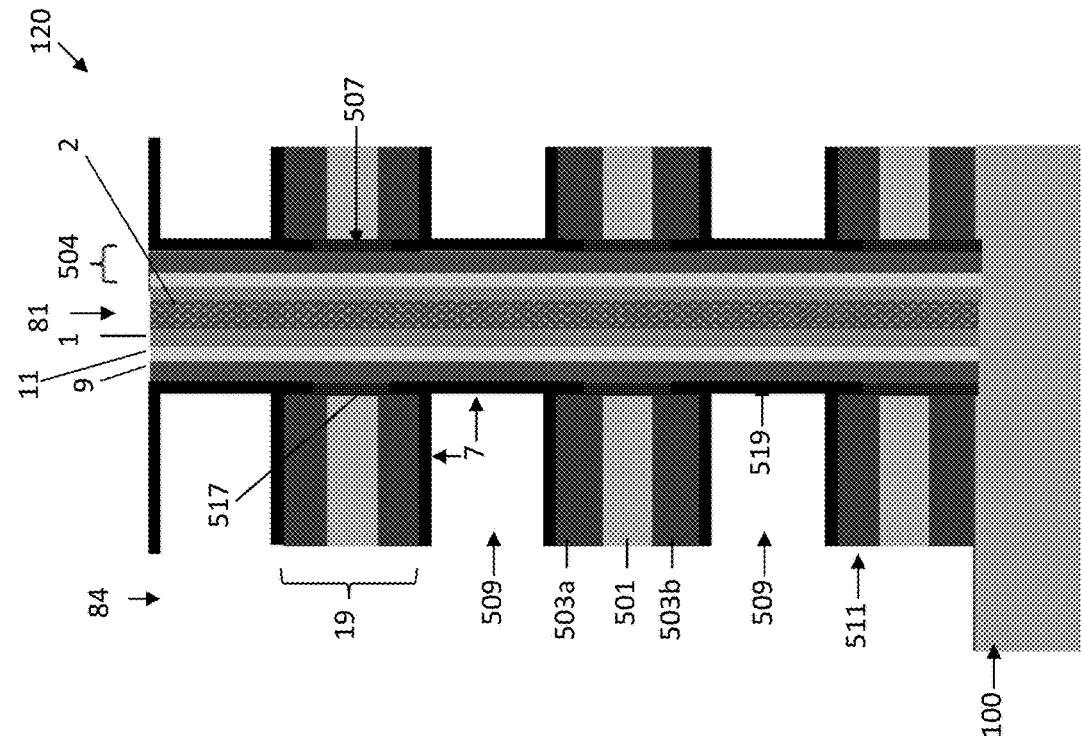
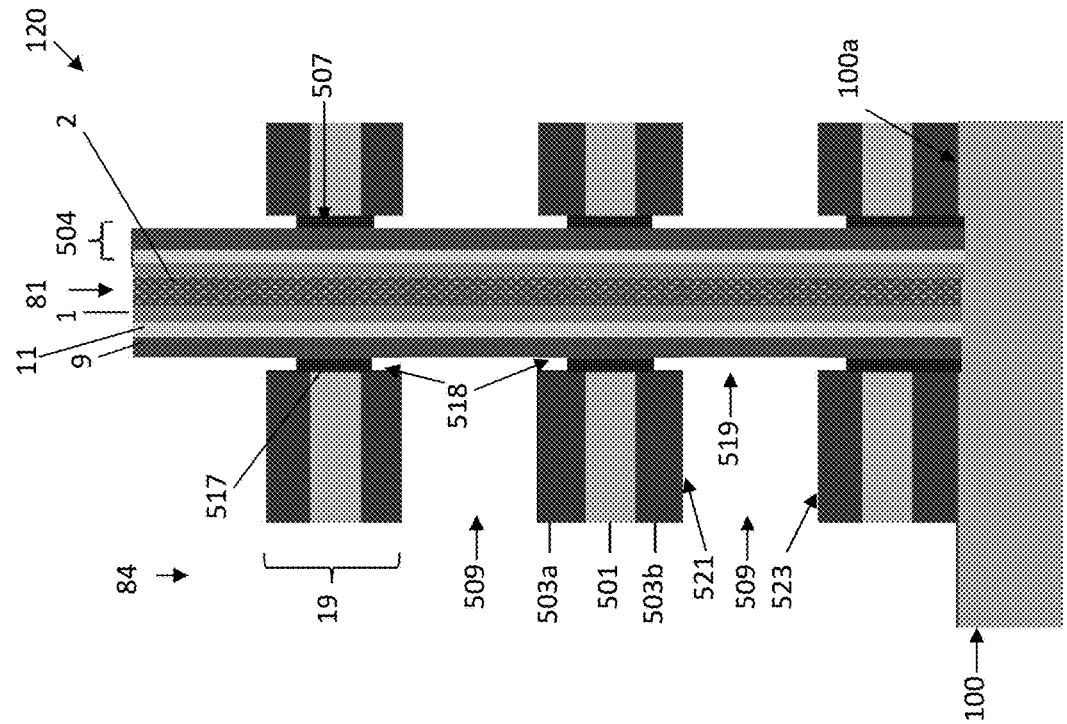

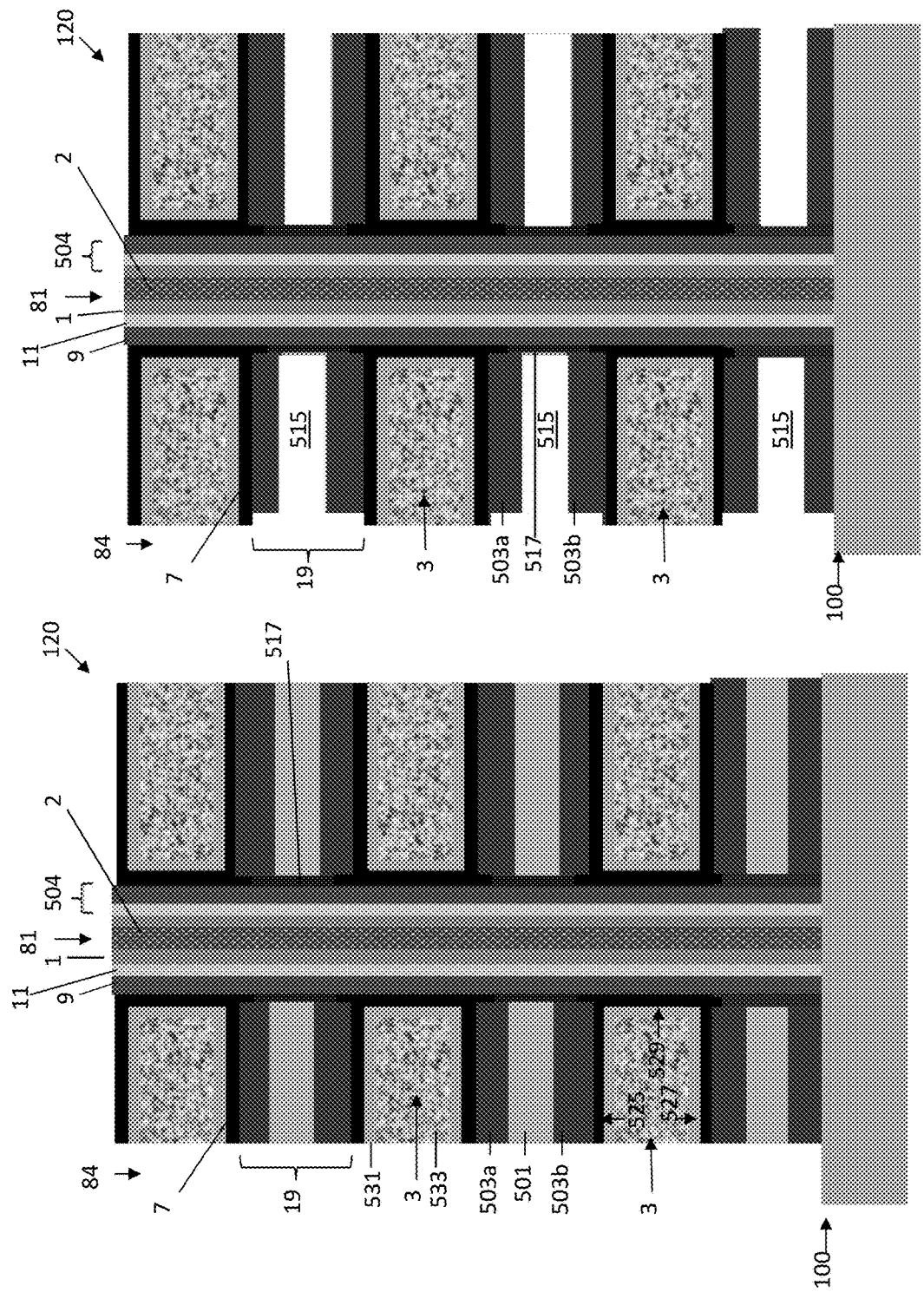

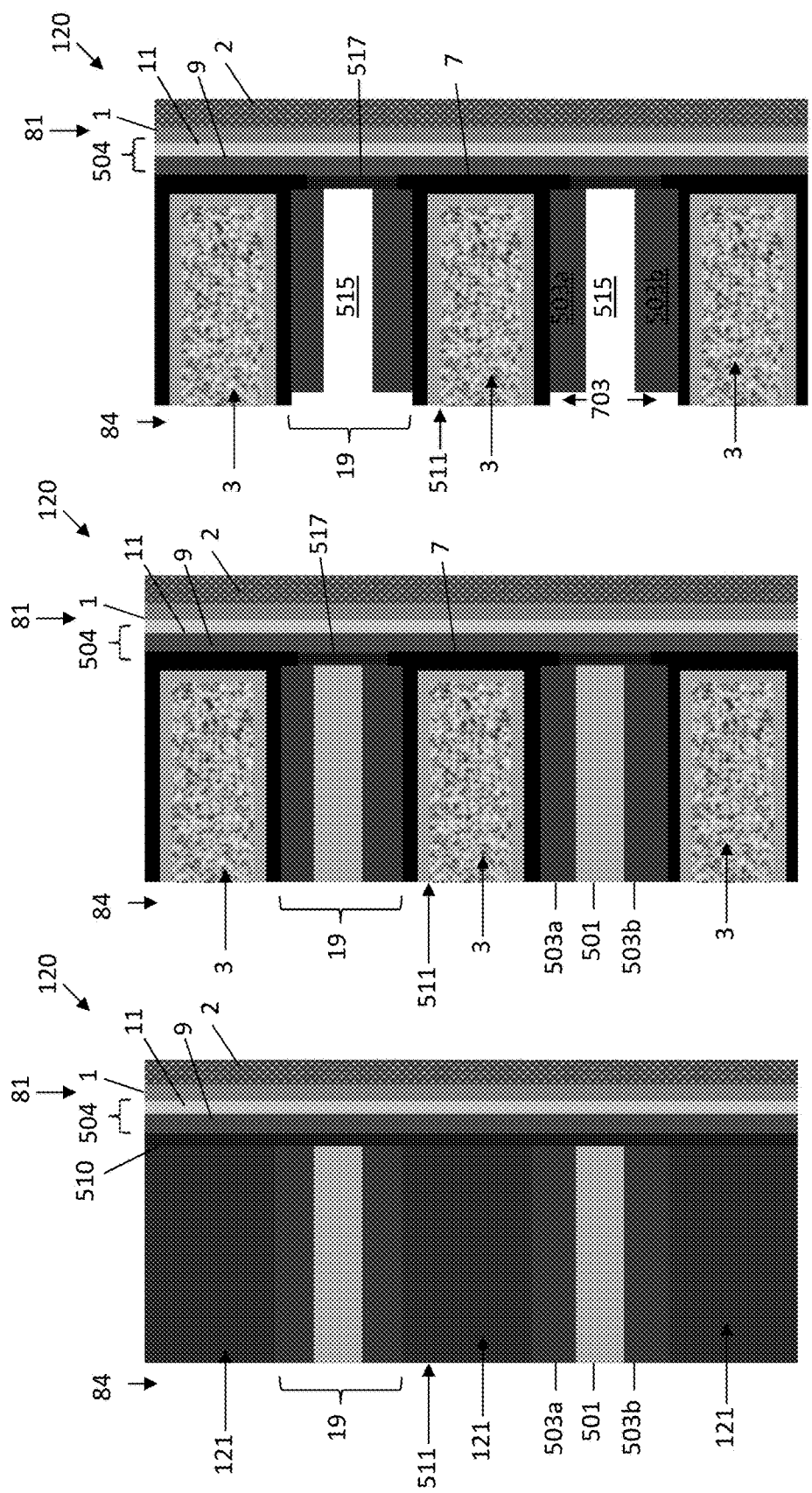

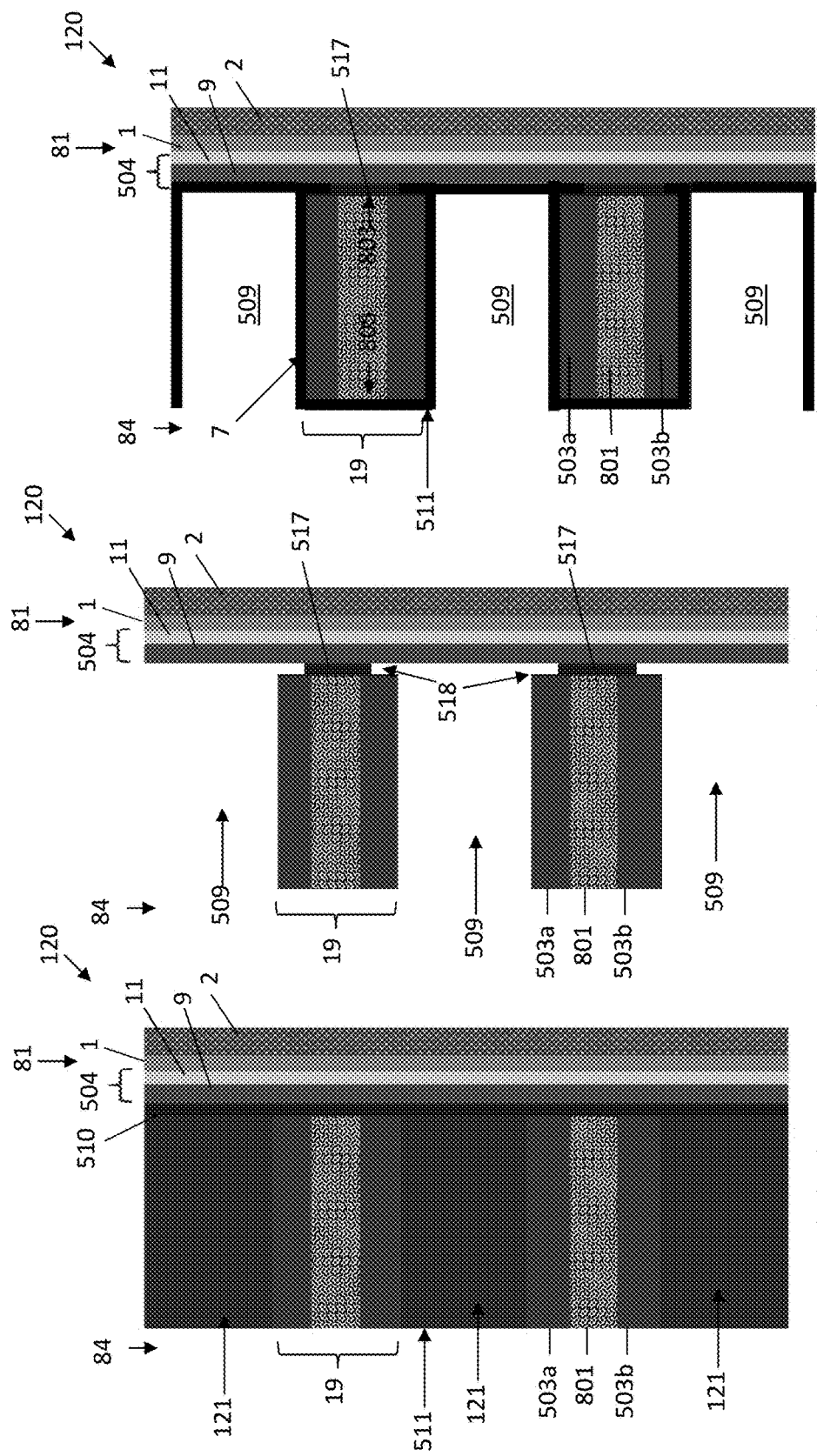

MONOLITHIC THREE DIMENSIONAL NAND STRINGS AND METHODS OF FABRICATION THEREOF

The present disclosure relates generally to the field of semiconductor devices and specifically to monolithic three dimensional NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active region of the NAND string is formed by a relatively difficult and time consuming process involving repeated formation of sidewall spacers and etching of a portion of the substrate, which results in a roughly conical active region shape.

SUMMARY

An embodiment relates to a monolithic three dimensional NAND string that includes a semiconductor channel where at least one end portion of the semiconductor channel extends substantially perpendicular to a major surface of a substrate. A plurality of control gate electrodes extend substantially parallel to the major surface of the substrate, where each control gate electrode includes a top surface, a bottom surface opposite the substrate and a first side surface facing the at least one end portion of the semiconductor channel. The plurality of control gate electrodes include at least a first control gate electrode located in a first device level and a second control gate electrode located in a second device level located over the major surface of the substrate and below the first device level.

An insulating material layer extends generally parallel to the major surface of the substrate and between the first control gate electrode located in the first device level and the second control gate electrode located in the second device level. The insulating material layer includes a first insulating material portion located adjacent to a bottom surface of the first control gate electrode, a second insulating material portion located adjacent to a top surface of the second control gate electrode, and a third insulating material portion located between the first insulating material portion and the second insulating material portion. The third insulating material portion includes a material that has a dielectric constant that is lower than a dielectric constant of a material of the first insulating layer portion and a dielectric constant of a material of the second insulating layer portion.

At least one charge storage region extends substantially perpendicular to the major surface of the substrate and located adjacent to at least the first side surfaces of each of the control gate electrodes. A blocking dielectric is located adjacent to at least the first side surfaces of each of the control gate electrodes and located between the charge storage region and each of the control gate electrodes. A tunnel dielectric is located between the charge storage region and the semiconductor channel.

Another embodiment relates to a monolithic three dimensional NAND string that includes a semiconductor channel where at least one end portion of the semiconductor channel extends substantially perpendicular to a major surface of a substrate. A plurality of control gate electrodes extend substantially parallel to the major surface of the substrate, where each control gate electrode includes a top surface, a bottom surface opposite the substrate and a first side surface facing the at least one end portion of the semiconductor channel. The plurality of control gate electrodes include at least a first control gate electrode located in a first device level and a second control gate electrode located in a second device level located over the major surface of the substrate and below the first device level.

A plurality of first insulating material layers extend substantially parallel to the major surface of the substrate between the respective device levels, where each of the plurality of first insulating material layers is adjacent to a bottom surface of the respective one of the plurality of control gate electrodes. A plurality of second insulating material layers extend substantially parallel to the major surface of the substrate between the respective device levels, where each of the plurality of second insulating material layers is adjacent to a top surface of a respective one of the plurality of control gate electrodes. A plurality of air gaps are located between the respective device levels, where each air gap includes a void region enclosed on a top side by a first insulating material layer and on a bottom side by a second insulating material layer, and at least a first portion of the air gap facing the semiconductor channel has a substantially rectangular-shaped cross-section in a plane extending perpendicular to the major surface of the substrate.

At least one charge storage region extends substantially perpendicular to the major surface of the substrate and located adjacent to at least the first side surfaces of each of the control gate electrodes. A blocking dielectric is located adjacent to at least the first side surfaces of each of the control gate electrodes and located between the charge storage region and each of the control gate electrodes. A tunnel dielectric is located between the charge storage region and the semiconductor channel.

Another embodiment relates to a method of making a monolithic three dimensional NAND string that includes forming a stack of alternating first material layers and second material layers over a major surface of a substrate, where each of the second material layers comprises a layer of a first silicon oxide material between two layers of a second silicon oxide material different from the first silicon oxide material, and the first material layers include a material that is different than the first silicon oxide material and the second silicon oxide material, etching the stack to form a front side opening in the stack, forming at least a portion of a memory film over a sidewall of the front side opening, and forming a semiconductor channel in the front side opening such that at least a portion of the memory film is located between the semiconductor channel and the sidewall of the front side opening, where at least one of an air gap or a material which has a dielectric constant below 3.9 is formed between the respective two layers of second silicon oxide material.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a conventional memory device comprising NAND strings.

FIGS. 5A-5I illustrate a method of making a NAND string having air gaps between the respective device levels according to one embodiment.

FIGS. 7A-7E illustrate a method of making a NAND string having a low-k insulating material located between the respective device levels according to an embodiment.

FIGS. 8A-8F illustrate a method of making a NAND string having a low-k insulating material located between the respective device levels according to another embodiment.

DETAILED DESCRIPTION

Various embodiments relate to monolithic three-dimensional NAND memory strings and methods of fabricating monolithic three-dimensional NAND memory strings. In one embodiment, air gaps are formed between control gate electrodes through the back side opening. In another embodiment a low-k dielectric is enclosed between two layers of silicon oxide material located between control gate electrodes.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
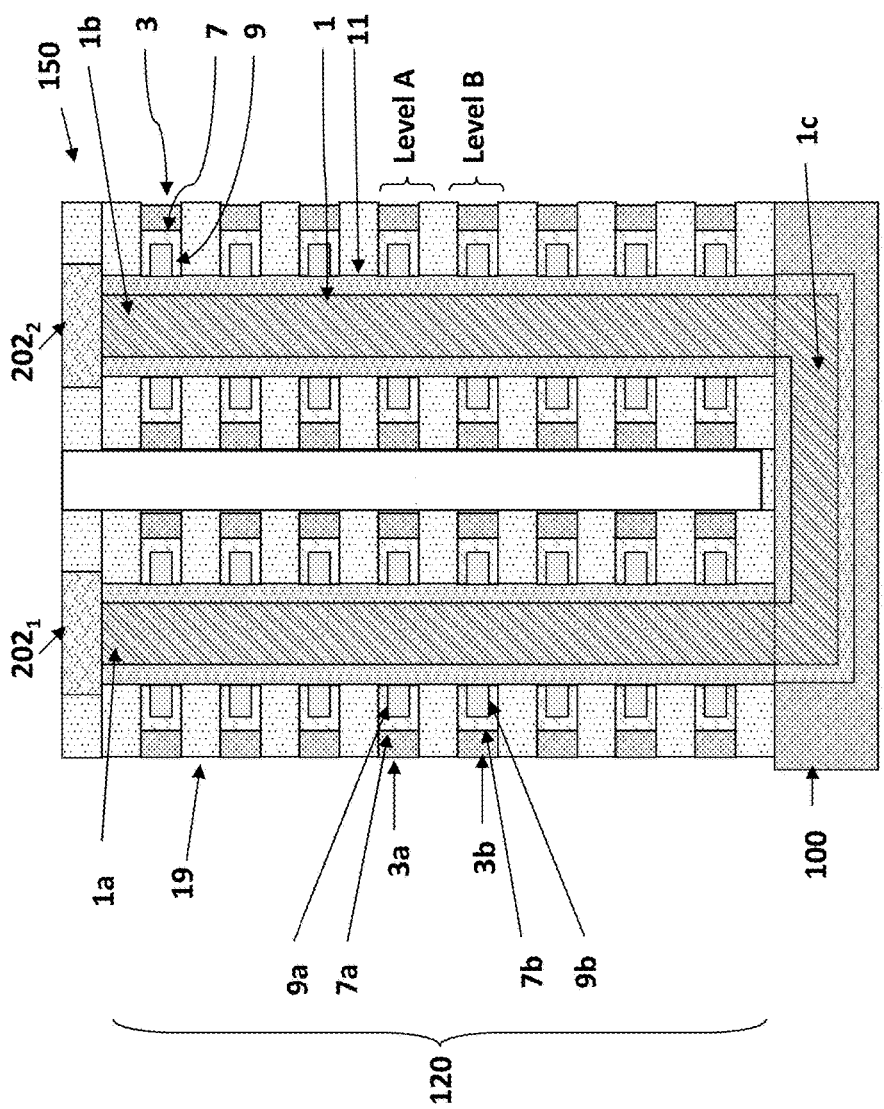
FIG. 3A is a side cross sectional view of a conventional NAND string of an embodiment with a U-shaped channel.
Figure 3B:
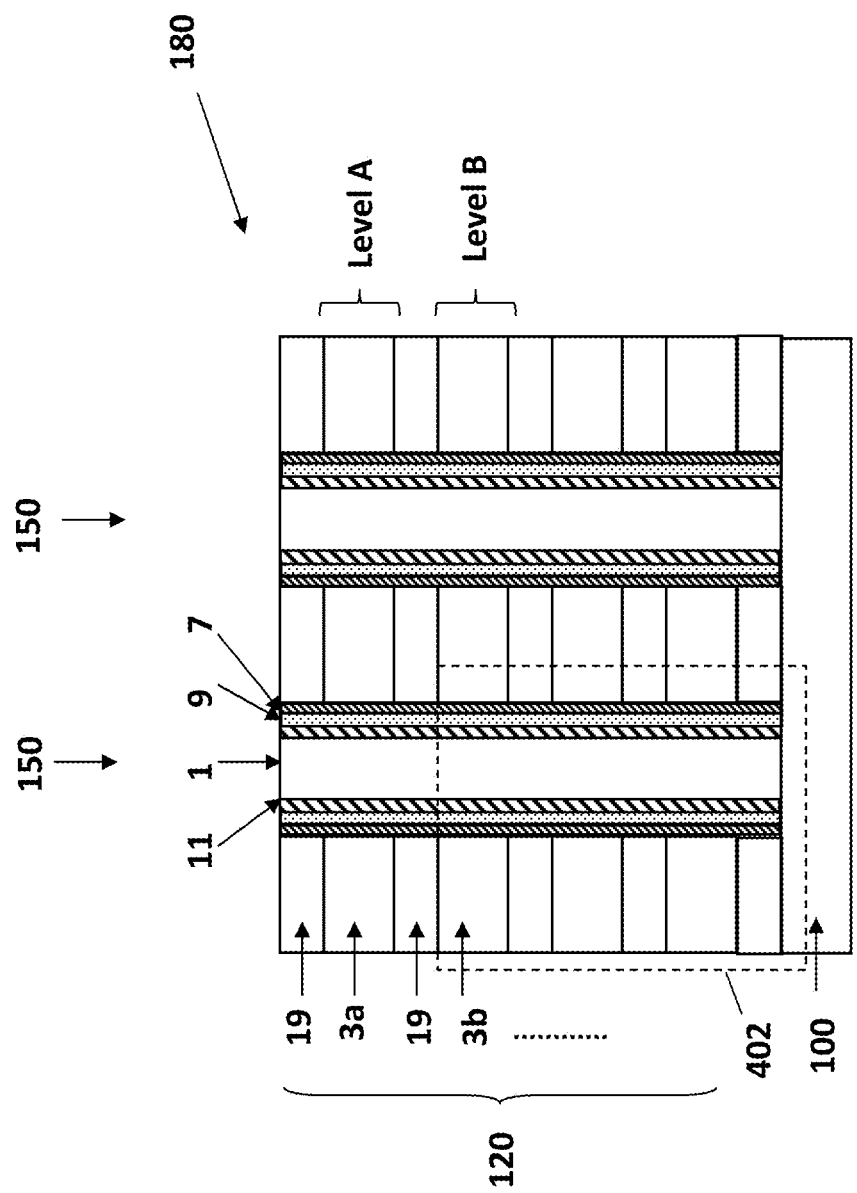
FIG. 3B is a side cross sectional view of another conventional NAND string.

In some embodiments, the monolithic three dimensional NAND string 150 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 2A and 3B. The channels 1 may be electrically connected to first and second (e.g., source and drain) electrodes 102, 202 which are schematically shown in FIGS. 1A and 2A. The first (e.g., source) electrode 102 may connect to the bottom of the channel 1 and the second (e.g., drain electrode 202) may connect to the top of the channel 1. The NAND string 150 may further include drain-side and source-side select or access transistors (not shown in FIGS. 1A, 2A and 3B for clarity) which may be located above and below the memory levels of the NAND string 150, respectively.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string 150 in this embodiment may further include drain-side and source-side select or access transistors (not shown in FIG. 3A for clarity), both of which may be located above the memory levels of the NAND string 150 and electrically connected to the respective wing portions 1a and 1b of the semiconductor channel 1.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

A memory array 180 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B electrically separated from each other by a plurality of electrically insulating layers 19 forming a stack 120 of alternating control gate electrodes 3 and insulating layers 19. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i.e., minor surface) of each control gate 3, as shown in FIG. 3B. The blocking dielectric 7 may comprise one or more layers having a plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprises a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions or segments 9 located between the blocking dielectric and the channel 1, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

FIG. 4 is a top schematic view illustrating a portion of a conventional memory device comprising one or more arrays 180 of NAND strings 150 having channels 1 located in respective memory holes 81 (e.g., front side openings). In this device, the memory holes 81 are circular, thereby resulting in cylindrical pillar shaped NAND strings 150. From the top view, the tunnel dielectric 11, charge storage region 9 and blocking dielectric 7 form concentric rings around the channel 1. The control gate 3 in each device level is generally slab shaped. A back side opening 84, such as a trench, electrically separates adjacent control gates 3 and arrays 180 (e.g., memory blocks) of NAND strings 150 from each other. As discussed in more detail below, the back side opening 84 may be used in the manufacture of NAND strings 150 according to some embodiments.

A first embodiment method of making a NAND string 150 is illustrated in FIGS. 5A-5I. In some embodiments, the methods described herein may be used to make a NAND string 150 having reduced capacitance between the control gates/word lines, which may improve program speed and device performance in three dimensional NAND string memory devices. In this embodiment, air gaps are formed within the insulating layers separating the control gates in the respective device levels.

Figure 5D:
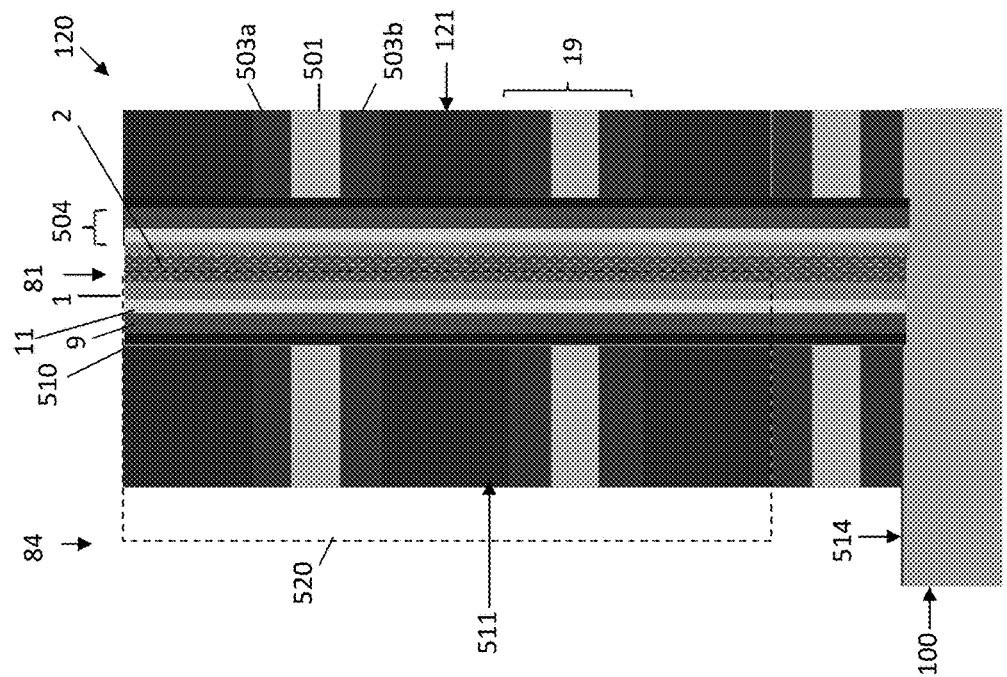

FIGS. 5A-5I are side cross-sectional views illustrating the formation of a portion of a NAND string array 180 that substantially corresponds to region 402 shown in dashed lines in FIG. 3B and taken along line A-A' in the top schematic view of FIG. 4. As illustrated in FIG. 5A, the method includes forming a stack 120 of alternating first material layers 121 and second material layers 19 over a major surface 100a of substrate 100. Each of the second material layers 19 includes a layer 501 of a first silicon oxide material between two layers 503a, 503b of a second silicon oxide material that is different from the first silicon oxide material. The layers 503a, 503b of the second silicon oxide material may be formed of the same silicon oxide material or of different silicon oxide materials that are each different from the first silicon oxide material. The layers 121, 501, 503a, 503b may be formed by a suitable deposition method, such as sputtering, CVD, PECVD, MBE, ALD, etc.

In one embodiment, the first material layers 121 comprise a material that is different than the first silicon oxide material and the second silicon oxide material. The first material layers 121 may comprise a sacrificial material, such as an insulating material that is different from the material of layers 501, 503a, 503b. For example, layers 501, 503a, 503b may comprise silicon oxide and layers 121 may comprise silicon nitride forming an ONON stack 120. Alternatively, layers 501, 503a, 503b may comprise silicon oxide and layers 121 may comprise polysilicon forming an OPOP stack 120.

In this embodiment, the layers 501 of the first silicon oxide material have a higher etch rate than the layers 503a, 503b of the second silicon oxide material when exposed to the same etching medium. Silicon oxide materials that may be used include, but are not limited to, dichlorosilane (DCS, $H_2SiCl_2$) based silicon oxides, disilane (DS, $Si_2H_6$) based silicon oxides, high aspect ratio process (HARP) non-plasma based CVD using tetraethyl orthosilicate (TEOS) and ozone sources based silicon oxides, high density plasma (HDP) CVD based silicon oxides, TEOS based silicon oxides and borosilicate glass (BSG) or borophosphosilicate glass (BPSG). Selective etching of silicon oxide materials may be performed by chemical dry etching or wet etching techniques. Example silicon oxide combinations which may be suitable for use with selective dry etching techniques are summarized in Table 1 below while combinations which may be suitable for use with wet etching techniques are summarized in Table 2 below.

TABLE 1

|  | Etch Selectivity | Etching Method |
|---|---|---|
| DCS Oxide:DS Oxide | 5:1-32:1 (tunable) | CDE (Chemical Dry Etching) |
| HARP:HDP Oxide | 230:1 | CDE (Chemical Dry Etching) |

TABLE 2

| Etch Selectivity (BPSG:TEOS) | Wet etch Method 99.7% Acetic acid:49% HF ratio |
|---|---|
| 27:1 | 200:1 |
| 42:1 | 100:1 |
| 55:1 | 50:1 |

As can be seen in Tables 1 and 2 above, the selectivity among the silicon oxide pairs may range from 5:1 to 230:1. Further, in the case of DCS:DS, the selectivity is tunable. That is, the selectivity between DCS and DS may be chosen based on the etching conditions, e.g. temperature, etchant composition, etc. In an embodiment, selectively removing a first silicon oxide material relative to a second silicon oxide material may include selective etching using a $HF:H_2O$ in a 1:5-15 ratio or a $HF:C_2H_4O_2$ in a 1:40-60 ratio dry etch chemistry using any suitable etching system, such as the Frontier® CDE system from Applied Materials, Inc.

In one embodiment, the layers 501 of first silicon oxide material may comprise silicon oxide deposited by CVD using a dichlorosilane ($H_2SiCl_2$) source, and the layers 503a, 503b of second silicon oxide material may comprise silicon oxide deposited by CVD using a disilane ($Si_2H_6$) source. In another embodiment, the layers 501 of first silicon oxide material may comprise silicon oxide deposited by High Aspect Ratio Process (HARP) non-plasma based CVD using TEOS and ozone sources, and the layers 503a, 503b of second silicon oxide material may comprise silicon oxide deposited by high density plasma (HDP) CVD. In another embodiment, the layers 501 of first silicon oxide material may comprises borosilicate glass or borophosphosilicate glass, and the layers 503a, 503b of second silicon oxide material may comprise silicon oxide deposited using a TEOS source.

In further embodiments, the layers 501 of first silicon oxide material may comprise silicon oxide that is doped with a material that increases the etch rate of the material. For example, the layers 501 of first silicon oxide material may comprise silicon oxide that is doped with at least one of boron and phosphorus. The layers 503a, 503b of second silicon oxide material may comprise silicon oxide that is not doped with boron or phosphorus (or is doped at a significantly lower level, such as by a factor of 10 or more, relative to the first silicon oxide material).

The various silicon oxide materials discussed above may be deposited by any suitable manner, such as low pressure chemical vapor deposition (LPCVD), plasma enhanced chemical vapor deposition (PECVD), chemical vapor deposition (CVD), and atmospheric pressure chemical vapor deposition (APCVD). Table 3 below summarizes some of the process parameters (i.e., reactor type, temperature, pressure, reactant gases and flow ratios) which may be suitable for deposition of the above described silicon oxide materials.

TABLE 3

| Oxide Type | CVD Reactor Type | Temperature | Pressure | Reactant gases & flow ratio |
|---|---|---|---|---|
| DCS Oxide | LPCVD | 700-900° C. | 125 mT-1 T | $DCS:N_2O$ = 0.25-1 |
| DS Oxide | PECVD | ~300° C. | 700 mT | $DS:N_2O$ = 3:1 |
| HARP (TEOS + Ozone) | Non-plasma based CVD | ~400° C. | 760 T (atmospheric) | TEOS and $O_3$ |
| HDP Oxide | PECVD | 300-400° C. | 2-10 T | Ar, TEOS($SiH_4$) & $O_2$ |
| TEOS | PECVD | <600° C. | 2-10 T | $TEOS:O_2$ = 1:10-1:20 |
| BPSG | PECVD | 300-500° C. |  | $B_2H_6$, Phosphine & $SiH_4$ |
| BPSG | APCVD | 300-500° C. | 760 T | $B_2H_6$, Phosphine & $SiH_4$ |

The formation of layers 121, 501, 503a, 503b may be followed by etching the stack 120 to form at least one front side opening 81 in the stack 120. A single front side opening 81 is illustrated in FIG. 5B. In embodiments, an array of front side openings 81 (e.g., cylindrical memory openings or holes) may be formed in locations where vertical channels of NAND strings 150 will be subsequently formed.

The front side openings 81 may be formed by photolithography and etching as follows. First, a memory hole mask (not shown in FIGS. 5A-B) may be formed over the stack 120 and patterned to form openings corresponding to the future locations of the front side openings 81. The mask may comprise any suitable material, such as one or more layer of photoresist and/or hard mask material. Then, the stack 120 may be etched (e.g., using reactive ion etching (RIE)) to form at least one opening 81 in the stack as shown in FIG. 5B. In the embodiment of FIG. 5B, the etching may be stopped at the substrate 100. Alternatively, an etch stop layer may be formed over the substrate and the etching may be stopped on the etch stop layer. Following the etching to form the front side memory openings 81, the mask may be removed.

Each of the front side memory openings 81 may include a sidewall 507 defined by the exposed surfaces of the layers 121, 501, 503a, 503b of the stack 120 and a bottom surface 508, which in this embodiment is defined by the exposed surface of the substrate 100.

Figure 5C:
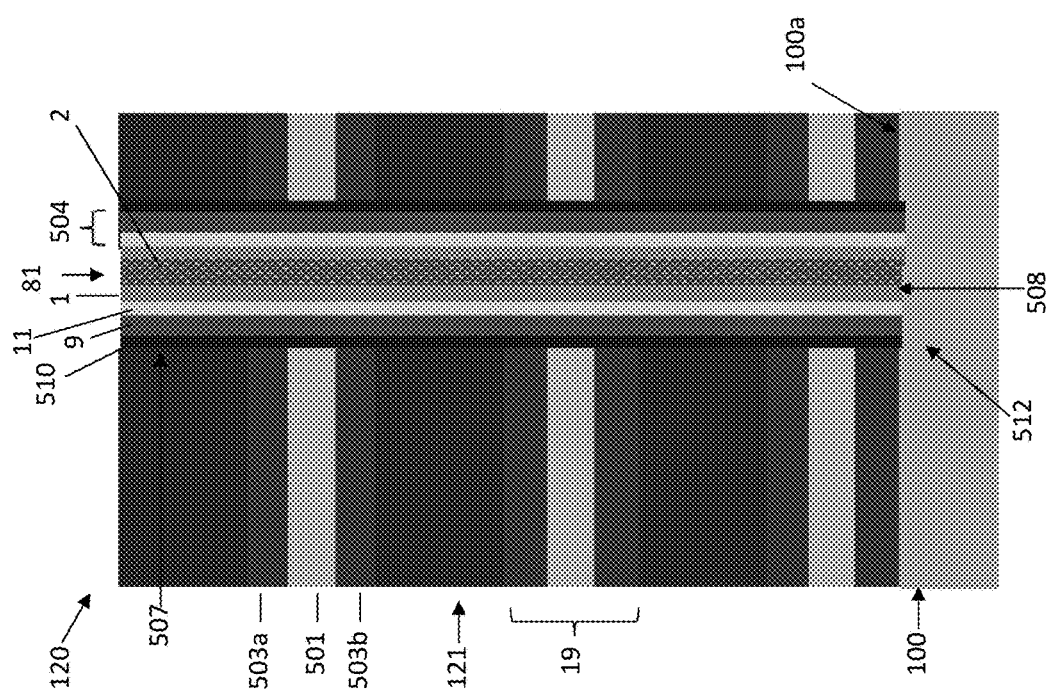

A cover layer 510 which may comprise an insulating material (e.g., silicon oxide) may be formed over at least the sidewalls 507 of the front side openings 81 in the stack 120, as shown in FIG. 5C. In embodiments, the cover layer 510 may be formed over the stack 120 including over the sidewalls 507 and bottom surfaces 508 of each of the front side openings 81. Optionally, an anisotropic etching process (e.g., an RIE process) may be performed to remove the cover layer 510 from the top surface of the stack 120 and from the bottom surface 508 of the front side openings 81, while the cover layer 510 may remain over the sidewalls 507 of the front side openings 81. Alternatively, the etching process may be combined with the memory film etching process described below.

Referring again to FIG. 5C, at least a portion of a memory film 504 may be formed over the cover layer 510 on at least the sidewalls 507 of the front side openings 81. In this embodiment, the memory film 504 includes a charge storage material 9 formed over the cover layer 510 and a tunnel dielectric 11 formed over the charge storage material 9. In embodiments, the memory film 504 may be formed over the stack 120 including over the sidewalls 507 and bottom surfaces 508 of each of the front side openings 81, and an anisotropic etching process (e.g., an RIE process) may be performed to remove the memory film 504 from the top surface of the stack 120 and from the bottom surface 508 of the front side openings 81, while the memory film 504 may remain over the sidewalls 507 of the front side openings 81. If the cover layer 510 was not removed previously from the bottom surface 508, then it may be removed from the bottom surface 508 together with the memory film 504 in the same anisotropic etching process.

In embodiments, the charge storage material 9 of the memory film 504 may comprise a continuous dielectric charge trap layer (e.g., a silicon nitride layer) that extends over the sidewall 507 of the front side opening 81 substantially perpendicular to the major surface 100a of the substrate 100. In other embodiments, the charge storage material 9 may comprise a plurality of spaced apart floating gates (e.g., comprising a semiconductor material, such as polysilicon or silicon germanium, or a metal or metal alloy, such as a metal nitride or metal silicide). The tunnel dielectric 11 may comprise a layer of an insulating material (e.g., an oxide layer, such as a silicon oxide or silicon oxynitride layer).

Referring again to FIG. 5C, a semiconductor channel 1 (e.g. a polysilicon or amorphous silicon layer) may be formed over the stack 120 including over the at least one memory film 504 along the sidewalls 507 of the front side openings 81. The semiconductor channel 1 may extend substantially perpendicular to the major surface 100a of the substrate 100, and at least a portion of the memory film 504 may be located between the semiconductor channel 1 and the sidewall 507 of the front side opening 81. The semiconductor channel 1 may contact the exposed surface of the substrate 100 at the bottom surfaces 508 of the front side openings 81, as shown in FIG. 5C. Optionally, the semiconductor channel 1 may contact a semiconductor channel portion of a lower (e.g., source-side) select gate transistor (not shown in FIG. 5C for clarity). The semiconductor channel portion of the lower select gate transistor may be formed as a protrusion extending from the major surface 100a of the substrate 100 or may be located within the semiconductor substrate 100, and may define the bottom surfaces 508 of the respective memory openings 81. The semiconductor channel portion of the lower select gate transistor may electrically couple the vertically-oriented semiconductor channel 1 extending within the front side opening 81 to a horizontal channel portion 512 located on or within the substrate 100 and extending substantially parallel to the major surface 100a of the substrate 100. Examples of suitable configurations and methods for making the lower (e.g., source side) select transistors of a monolithic three dimensional array of vertical NAND strings 150 are described, for example, in U.S. patent application Ser. No. 14/133,979, filed on Dec. 19, 2013, U.S. patent application Ser. No. 14/225,116, filed on Mar. 25, 2014, U.S. patent application Ser. No. 14/225,176, filed on Mar. 25, 2014, and U.S. Provisional Patent Application No. 61/977,173, filed on Apr. 9, 2014, all of which are incorporated by reference herein for all purposes.

An optional insulating fill material 2 (e.g., an oxide, such as silicon oxide) may be formed over the semiconductor channel 1 and fill the front side openings 81, as shown in FIG. 5C.

Referring to FIG. 5D, the stack 120 may be etched (e.g., through a mask patterned by photolithography, not shown in FIG. 5D) to form one or more back side openings (e.g., trenches) 84 in the stack 120. In this embodiment, the back side opening (e.g., trench) 84 extends through the entire stack 120 to the semiconductor substrate 100. The layers 121, 501, 503a, 503b of the stack 120 may at least partially define at least one sidewall 511 of the back side opening 84, and the substrate 100 may define the bottom surface 514 of the back side opening 84. Region 520 shown in dashed lines will be described below in connection with FIGS. 6A-8F.

Referring to FIG. 5E, at least a portion of the first material layers 121 may be removed through the back side opening 84 to form back side recesses 509 between the second material layers 19. Layers 121 may be removed by selective etching, such as a silicon nitride selective etching (e.g., a hot phosphoric acid wet etch) which removes silicon nitride layers 121 but does not remove the silicon oxide material of layers 19.

As shown in FIG. 5E, portions of the cover layer 510 adjacent to the first material layers 121 may be removed by etching to expose the memory film 504 (e.g., the charge storage material 9) over a first side surface 519 of each of the back side recesses 509. The removal of portions of the cover layer 510 may provide vertically spaced-apart segments 517 of the cover layer 510 that extend substantially perpendicular to the major surface 100a of the substrate 100 and over the sidewalls 507 of the memory openings 81. The portions of the cover layer 510 may be removed during the same etching step during which layers 121 are removed, or during a different etching step. The etching may also remove portions of the cover layer 510 that are adjacent to the layers 503a, 503b of the second silicon oxide material to provide void areas 518 between at least a portion of each of the layers 503a, 503b of second silicon oxide material and the memory film 504, as shown in FIG. 5E. The spaced apart segments 517 of the cover layer 510 may be located between the memory film 504 and each of the layers 501 of the first silicon oxide material.

Referring to FIG. 5F, a blocking dielectric 7 may be formed in the back side recesses 509 through the back side opening 84. The blocking dielectric 7 may be formed over the exposed memory film 504 on the first side surfaces 519 of each of the back side recesses 509 and within the void areas 518 between the memory film 504 and layers 503a, 503b. The spaced apart segments 517 of the cover layer 510 may be located between respective portions of the blocking dielectric 7 that extend along the sidewall 507 of the front side opening 81. The blocking dielectric 7 may also be formed adjacent to the layers 503b of the second silicon oxide material on the top surfaces 521 of the back side recesses 509 and adjacent to the layers 503a of the second silicon oxide material on the bottom surfaces 523 of the back side recesses 509. The blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, $HfSiO$, $TaO_2$ or other metal oxides. In one embodiment, the blocking dielectric 7 may include a stack comprising at least one layer of silicon oxide and at least one layer of a metal oxide, such as aluminum oxide and/or hafnium oxide.

In this embodiment, any blocking dielectric 7 located within the back side opening 84, including on the sidewall 511 of the back side opening 84 may be removed from the back side opening 84 (e.g., by etching) as shown in FIG. 5F.

Referring to FIG. 5G, control gate electrodes 3 may be formed over the blocking dielectric 7 in the back side recesses 509 through the back side opening 84. Each of the control gate electrodes 3 may include a top surface 525, a bottom surface 527 opposite the top surface 525, and a first side surface 529 facing the vertically-extending semiconductor channel 1 in the memory opening 81. The control gate electrodes 3 may be formed over the blocking dielectric 7 such that the blocking dielectric 7 surrounds each of the control gate electrodes 3 on the top 525, bottom 527 and first side surfaces 529 of the control gate electrode 3. Each of the first material layers 19 of the stack 120 may be separated from the adjacent control gate electrode(s) 3 by the blocking dielectric 7. Each of the control gate electrodes 3 may be located in a respective device level (e.g., Level A, Level B, etc. as shown in FIGS. 1A, 2A, 3A and 3B) over the major surface 100a of the substrate 100.

Each of the control gate electrodes 3 may comprise one or more electrically conductive materials, such as a metal, metal nitride, metal silicide or heavily doped semiconductor material. In one embodiment, the control gate electrodes 3 are formed by depositing a metal nitride liner material 531 (e.g., tungsten nitride (WN) or titanium nitride (TiN) liner) over the blocking dielectric 7 in the back side recesses 509, followed by depositing a metal material 533 (e.g., tungsten) over the metal nitride liner material 531 to fill the back side recesses 509. Any of the metal material 533 and/or metal nitride liner material 531 located in the back side opening 84 may be removed from the back side opening 84 (e.g., via one or more etching steps) as shown in FIG. 5G.

Referring to FIG. 5H, at least a portion of the layers 501 of first silicon oxide material may be removed by etching through the back side opening 84 to form second back side recesses 515 within the second material layers 19 of the stack 120. Each of the second back side recesses 515 may be located between the layers 503a, 503b of the second silicon oxide material. As discussed above, the first silicon oxide material of layers 501 may have a higher etch rate than the second silicon oxide materials of layers 503a, 503b. Thus, layers 501 may be selectively etched relative to layers 503a, 503b to form the second back side recesses 515 between layers 503a and 503b. Suitable selective dry and wet chemical etching techniques for silicon oxide materials are described above, for example, with reference to Tables 1 and 2.

In the embodiment shown in FIG. 5H, the layers 501 of first silicon oxide material may be completely removed to expose the segments 517 of the cover layer 510 in the second back side recesses 515.

Figure 5I:
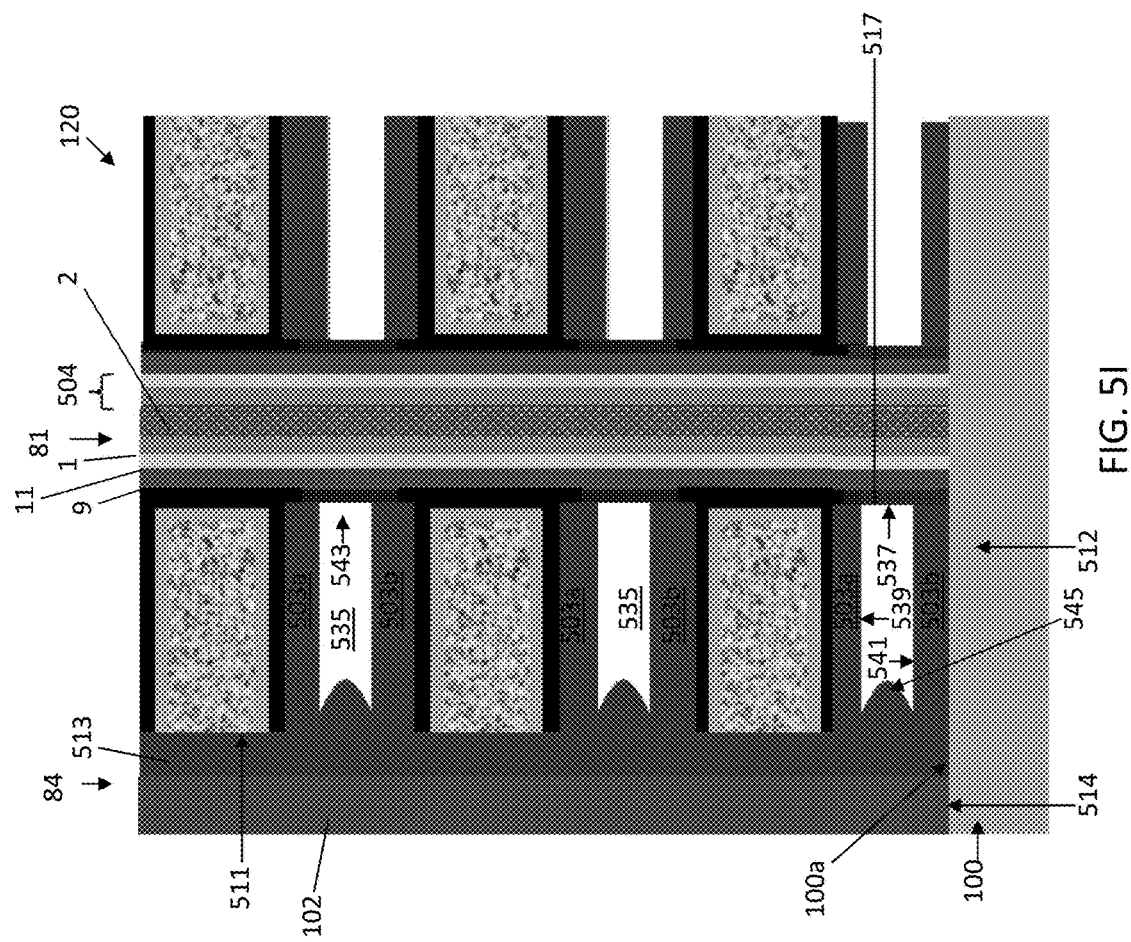

Referring to FIG. 5I, a layer of insulating material 513 may be formed over the sidewall 511 of the back side opening 84 to enclose the second back side recesses 515 and form air gaps 535 between the respective layers 503a, 503b of the second silicon oxide material. Each of the air gaps 535 may comprise a void region enclosed on a first side 537 by a segment 517 of the cover layer 510, on a top side 539 by a layer 503a of the second silicon oxide material and on a bottom side 541 by a layer 503b of the second silicon oxide material. As shown in FIG. 5I, at least a first portion 543 of the air gaps 535 facing the semiconductor channel 1 may have a substantially rectangular-shaped cross-section in a plane extending perpendicular to the major surface 100a of the substrate 100 (e.g., a plane which extends from the back side opening 84 to the front side opening 81 perpendicular to the major surface 100a of the substrate 100). A substantially rectangular-shaped cross-section includes an exactly rectangular-shaped cross-section or a cross-section which deviates from the exact rectangular shape due to: (i) unintentional etching of layers 503a, 503b and/or 517 during the selective etching to remove layers 501 (due to unavoidable non-uniformity and/or limited selectivity of the etch) which results in nanoscale curvature of layers 503a, 503b and/or 517 in region 543; (ii) due to the unavoidable nanoscale non-uniformity of cover layer 510 thickness that results during deposition of layer 510 into opening 81; and/or (iii) due to unavoidable nanoscale non-uniformity or curvature of the sidewall 507 of the front side opening 81 that results during etching of the opening 81.

Each of the air gaps 535 may be enclosed on a second side 545 of the air gap 535 opposite the semiconductor channel 1 by the layer of insulating material 513. In embodiments, the insulating material 513 may define a substantially concave second side surface 545 of the air gap 535, as shown in FIG. 5I, because layer 513 protrudes into the air gaps 535.

A source side electrode 102 (i.e., source line) comprising an electrically conductive material may be formed within the back side opening 84, as shown in FIG. 5I. The layer of insulating material 513 may electrically insulate the source side electrode 102 from the plurality of control gates 3 along the sidewall 511 of the back side opening 84. The source side electrode 102 may comprise one or more electrically conductive materials, such as a metal, metal nitride, metal silicide, heavily doped semiconductor material, or combinations thereof. In embodiments, the source side electrode 102 may be formed in contact with a source region (e.g., a doped region of the substrate 100 which is implanted into the substrate through the back side opening 84, not shown in FIG. 5I) located at the bottom 514 of the back side opening 84. The source side electrode 102 may electrically contact the semiconductor channel 1 from below the device levels of the NAND string 150 via the source region and the horizontal channel portion 512 extending on or within the substrate 100.

Figure 6B:
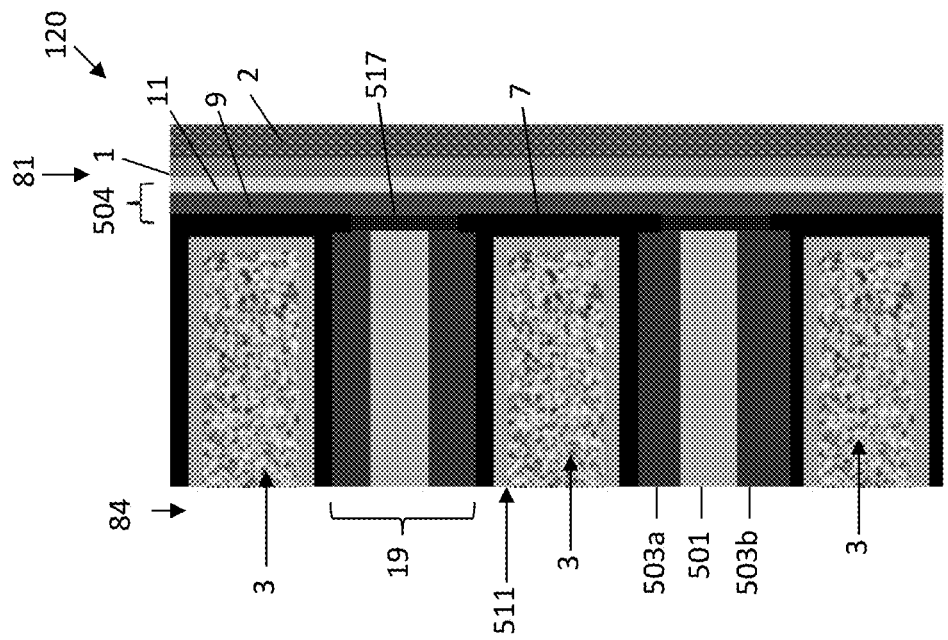
FIGS. 6A-6D illustrate a method of making a NAND string having air gaps between the respective device levels according to another embodiment.
Figure 6A:
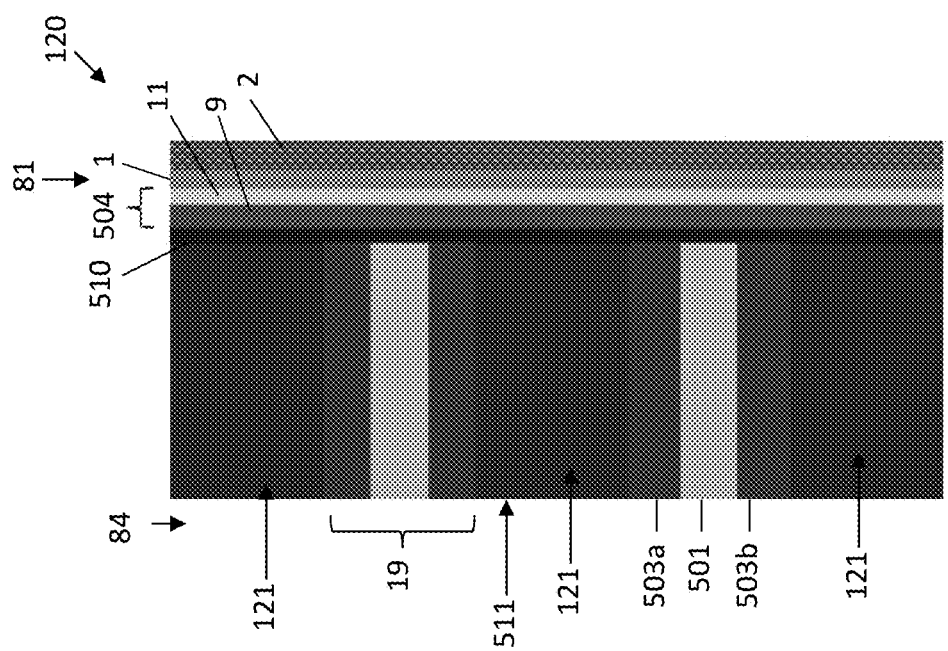

A second embodiment method of making a NAND string 150 with air gaps between the respective device levels is illustrated in FIGS. 6A-6D. FIGS. 6A-6D are partial cross-section views showing the region 520 of the stack 120 indicated by dashed lines in FIG. 5D. FIG. 6A corresponds to FIG. 5D, and illustrates the stack 120 after formation of the cover layer 510, the at least one memory film 504, the semiconductor channel 1 and the insulating fill material 2 within the front side memory opening 81, and the etching of the stack 120 to form the back side opening 84. FIG. 6B corresponds to FIG. 5G, and illustrates the stack 120 after removing the first material layers 121 and portions of the cover layer 510 through the back side opening 84 to form the back side recesses 509 (see FIGS. 5E-5F) and spaced apart segments 517 of the cover layer 510, forming a blocking dielectric 7 through the back side opening within each of the back side recesses 509, and forming control gate electrodes 3 through the back side opening 84 and over the blocking dielectric 7 within each of the back side recesses 509.

Figure 6D:
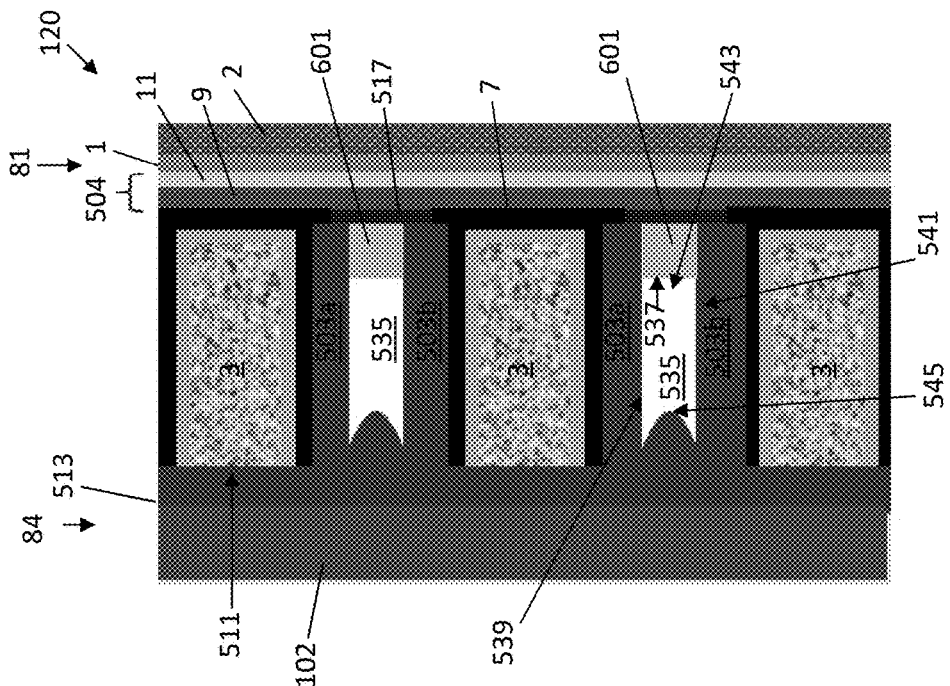
Figure 6C:
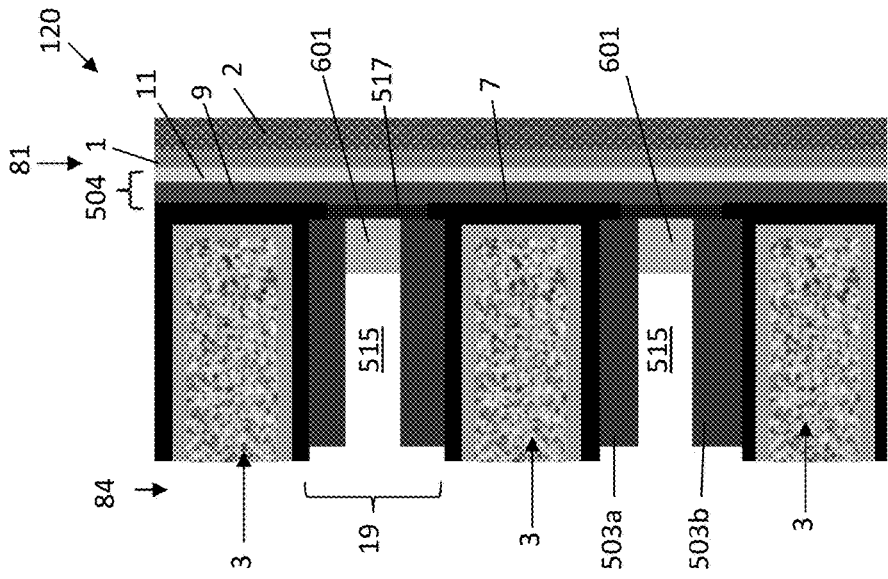

Referring to FIG. 6C, the layers 501 of the first silicon oxide material may be selectively etched relative to the layers 503a, 503b of the second silicon oxide material through the back side opening 84 to form second back side recesses 515 within the second material layers 19 of the stack 120. In this embodiment, only a portion of the first silicon oxide material 501 is removed such that portions 601 of the first silicon oxide material remain within the second back side recesses 515 between the layers 503a, 503b of the second silicon oxide material and adjacent to the segments 517 of the cover layer 510.

Referring to FIG. 6D, a layer of insulating material 513 may be formed over the sidewall 511 of the back side opening 84 to enclose the second back side recesses 515 and form air gaps 535 between the respective layers 503a, 503b of the second silicon oxide material. In this embodiment, each of the air gaps 535 is enclosed on the first side 537 by the portion 601 of the first silicon oxide material which remains in the second back side recess 515. The top 539 and bottom 541 sides of the air gaps 535 may be enclosed by the layers 503a and 503b of the second silicon oxide material, respectively, and the second sides 545 may be enclosed by the layer of insulating material 513, as described above in connection with FIG. 5I. The portions 543 of the air gaps 535 adjacent to the remaining portions 601 of the first silicon oxide material may have a substantially rectangular-shaped cross-section in a plane extending perpendicular to the major surface 100a of the substrate 100.

A source side electrode 102 (i.e., source line) comprising an electrically conductive material may be formed within the back side opening 84, as described above with reference to FIG. 5I.

Further embodiment methods of making a NAND string 150 having a low-k insulating material between the respective device levels. In various embodiments, a low-k insulating material between the device levels may provide reduced capacitance between the control gates/word lines, which may improve program speed and device performance in three dimensional NAND string memory devices.

Figure 7E:
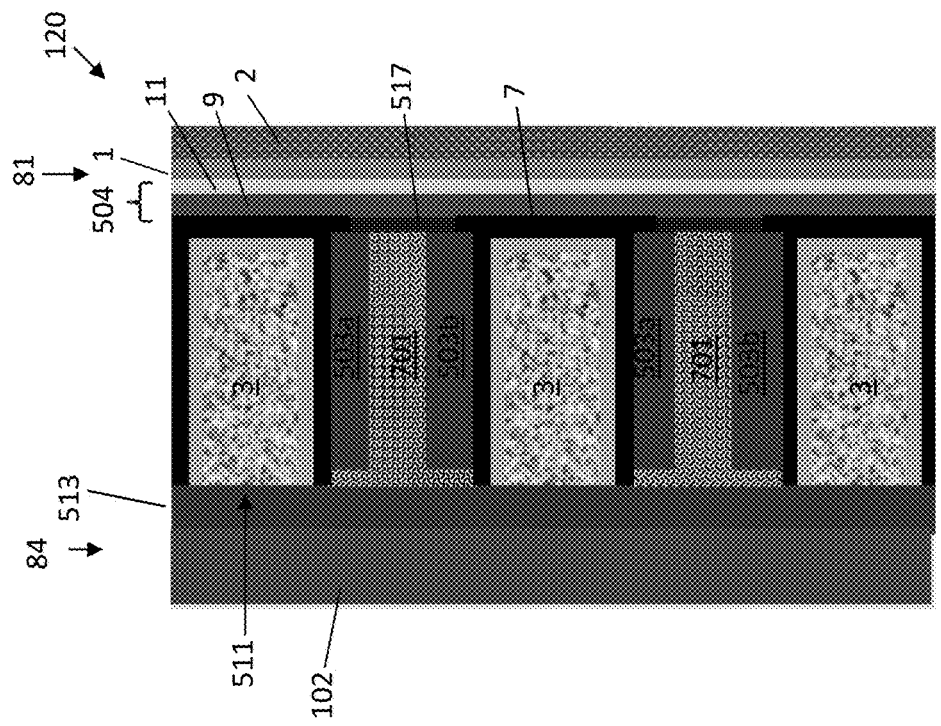

FIGS. 7A-7E illustrate a first embodiment method of making a NAND string having a low-k insulating material located between the respective device levels. FIGS. 7A-7E are partial cross section views showing the region 520 of the stack 120 indicated by dashed lines in FIG. 5D. As in the embodiments of FIGS. 5A-5I and 6A-6D, each of the first material layers 19 of the stack 120 includes a layer 501 of a first silicon oxide material sandwiched between layers 503a, 503b of a second silicon oxide material, where the first silicon oxide material has a higher etch rate than the second silicon oxide material when exposed to the same etching medium. FIG. 7A corresponds to FIG. 5D and illustrates the stack 120 after formation of the cover layer 510, the at least one memory film 504, the semiconductor channel 1 and the insulating fill material 2 within the front side memory opening 81, and the etching of the stack 120 to form the back side opening 84. FIG. 7B corresponds to FIG. 5G, and illustrates the stack 120 after removing the first material layers 121 and portions of the cover layer 510 through the back side opening 84 to form the back side recesses 509 (see FIGS. 5E-5F) and spaced apart segments 517 of the cover layer, forming a blocking dielectric 7 through the back side opening within each of the back side recesses 509, and forming control gate electrodes 3 through the back side opening 84 and over the blocking dielectric 7 within each of the back side recesses 509.

Referring to FIG. 7C, the layers 501 of the first silicon oxide material may be selectively etched relative to the layers 503a, 503b of the second silicon oxide material through the back side opening 84 to form second back side recesses 515 within the second material layers 19 of the stack 120. In this embodiment, the layers 501 of the first silicon oxide material are completely removed to expose the segments 517 of the cover layer 510 in the second back side recesses 515. Alternatively, a portion of the first silicon oxide material may remain in the second back side recesses 515, as described above in connection with FIGS. 6A-6D.

Figure 7D:
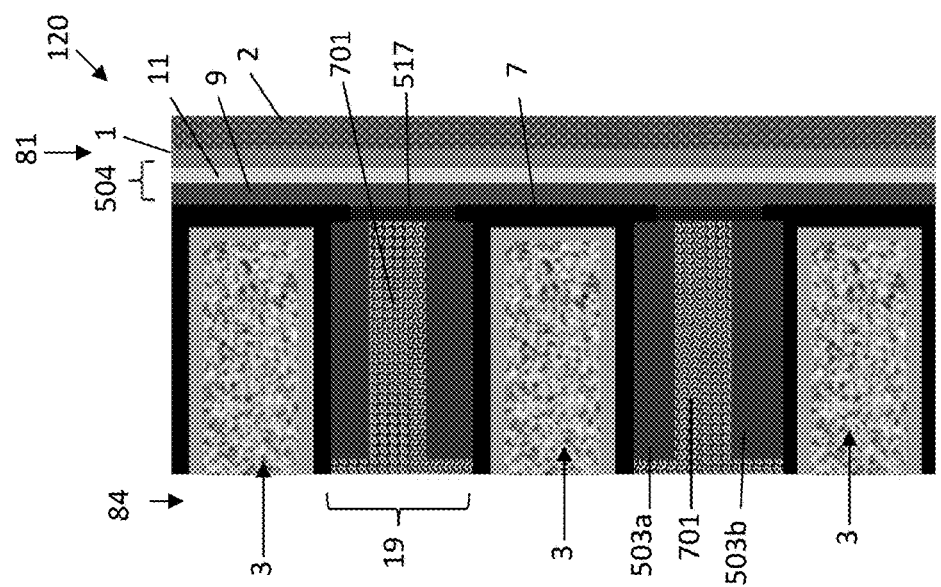

Referring to FIG. 7D, a layer 701 of a third silicon oxide material may be formed in each of the second back side recesses 515 through the back side opening 84, where the third silicon oxide material has a lower dielectric constant than the dielectric constant of the second silicon oxide material. The third silicon oxide material may be different than both the first silicon oxide material and the second silicon oxide material. In embodiments, the third silicon oxide material may be a low-k dielectric, which for the purposes of this disclosure is defined as a material having a dielectric constant ($\kappa$) below 3.9 (e.g., $1.5 \leq \kappa < 3.9$, such as $2.0 \leq \kappa \leq 3.8$, including $2.5 \leq \kappa \leq 3.6$).

In embodiments, the layers 701 of the third silicon oxide material may be doped to provide a dielectric constant that is lower than the dielectric constant of the second silicon oxide material. The third silicon oxide material may be doped with at least one of fluorine and carbon, for example.

In some embodiments, the layers 503a, 503b of the second silicon oxide material may be slightly recessed within the second back side opening 515. As shown in FIG. 7C, for example, recessed portions 703 may be formed in the layers 503a, 503b of second silicon oxide material. These recessed portions 703 may be formed during an etching step, such as an etching step to remove the blocking dielectric 7 from the sidewall 511 of the back side opening 84 and/or the selective etching step to remove the layers 501 of first silicon oxide material. In embodiments, the layer 701 of the third silicon oxide material may fill these recessed portions 703, as shown in FIG. 7D.

An etchback step may be performed to remove any of the third silicon oxide material from the back side opening 84, as shown in FIG. 7D. Referring to FIG. 7E, a layer of insulating material 513 may be formed on the sidewall 511 of the back side opening 84, and a source side electrode 102 (i.e., source line) comprising an electrically conductive material may be formed within the back side opening 84, as described above with reference to FIG. 5I.

FIGS. 8A-8F illustrate another embodiment method of making a NAND string having a low-k insulating material located between the respective device levels. FIGS. 8A-8F are partial cross section views showing the region 520 of the stack 120 indicated by dashed lines in FIG. 5D. The embodiment of FIGS. 8A-8F differs from the embodiments of FIGS. 5A-5I, 6A-6D and 7A-7E in that the stack 120 is formed with alternating first material layers 121 and second material layers 19, where each of the second material layers 19 comprises a permanent layer 801 of a first silicon oxide material which is not removed during subsequent processing. Layer 801 is located between two layers 503a, 503b of a second silicon oxide material, and the first silicon oxide material has a lower dielectric constant than the second silicon oxide material. In embodiments, the first silicon oxide material layer 801 may be a low-k material having a dielectric constant that is less than 3.9, as described above.

In embodiments, the layers 801 of first silicon oxide material may be doped to provide a dielectric constant that is lower than the dielectric constant of the second silicon oxide material. The first silicon oxide material may be doped with at least one of fluorine and carbon, for example. In embodiments, the layers 503a, 503b of second silicon oxide material may comprise silicon oxide formed by plasma enhanced chemical vapor deposition (PECVD) using a tetraethyl orthosilicate (TEOS) source.

FIG. 8A illustrates the stack 120 after formation of the cover layer 510, the at least one memory film 504, the semiconductor channel 1 and the insulating fill material 2 within the front side memory opening 81, and the etching of the stack 120 to form the back side opening 84, as discussed above.

FIG. 8B corresponds to FIG. 5E described above, and illustrates the first material layers removed through the back side opening 84 to form back side recesses 509 between the second material layers 19. Layers 121 may be removed by selective etching, such as a silicon nitride selective etching (e.g., a hot phosphoric acid wet etch) which removes silicon nitride layers 121 but does not remove the silicon oxide material of layers 19.

Also shown in FIG. 8B are portions of the cover layer 510 adjacent to the first material layers 121 removed by etching to expose the memory film 504 (e.g., the charge storage material 9) in each of the back side recesses 509 and forming vertically spaced-apart segments 517 of the cover layer 510 over the sidewalls 507 of the memory openings 81. The etching may also remove portions of the cover layer 510 that are adjacent to the layers 503a, 503b of the second silicon oxide material to provide void areas 518 between at least a portion of each of the layers 503a, 503b of second silicon oxide material and the memory film 504. The spaced apart segments 517 of the cover layer 510 may be located between the memory film 504 and each of the layers 801 of the first silicon oxide material.

Referring to FIG. 8C, a blocking dielectric 7 may be formed in the back side recesses 509 through the back side opening 84. The blocking dielectric 7 may be formed over the portions of the memory film 504 exposed in the back side recesses 509 and within the void areas 518 between the memory film 504 and layers 503a, 503b. The embodiment of FIG. 8C differs from the embodiments of FIGS. 5A-5I, 6A-6D and 7A-7E in that the blocking dielectric 7 in FIG. 8C extends over the sidewall 511 of the back side opening 84, including over the exposed minor surfaces of layers 503a, 801 and 503b. In this embodiment, at least a portion of the blocking dielectric 7 may remain on the sidewall 511 of the back side opening 84, and each of the second material layers 19 of the stack 120 may have a first side surface 803 facing the semiconductor channel 1 and a second side surface 805 opposite the first side surface 803 and the blocking dielectric 7 extends over the second side surfaces 805 of the layers 19.

The blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, HfSiO, $TaO_2$ or other metal oxides. In one embodiment, the blocking dielectric 7 may include a stack comprising at least one layer of silicon oxide and at least one layer of a metal oxide, such as aluminum oxide and/or hafnium oxide.

Figures 8D, 8E, 8F:
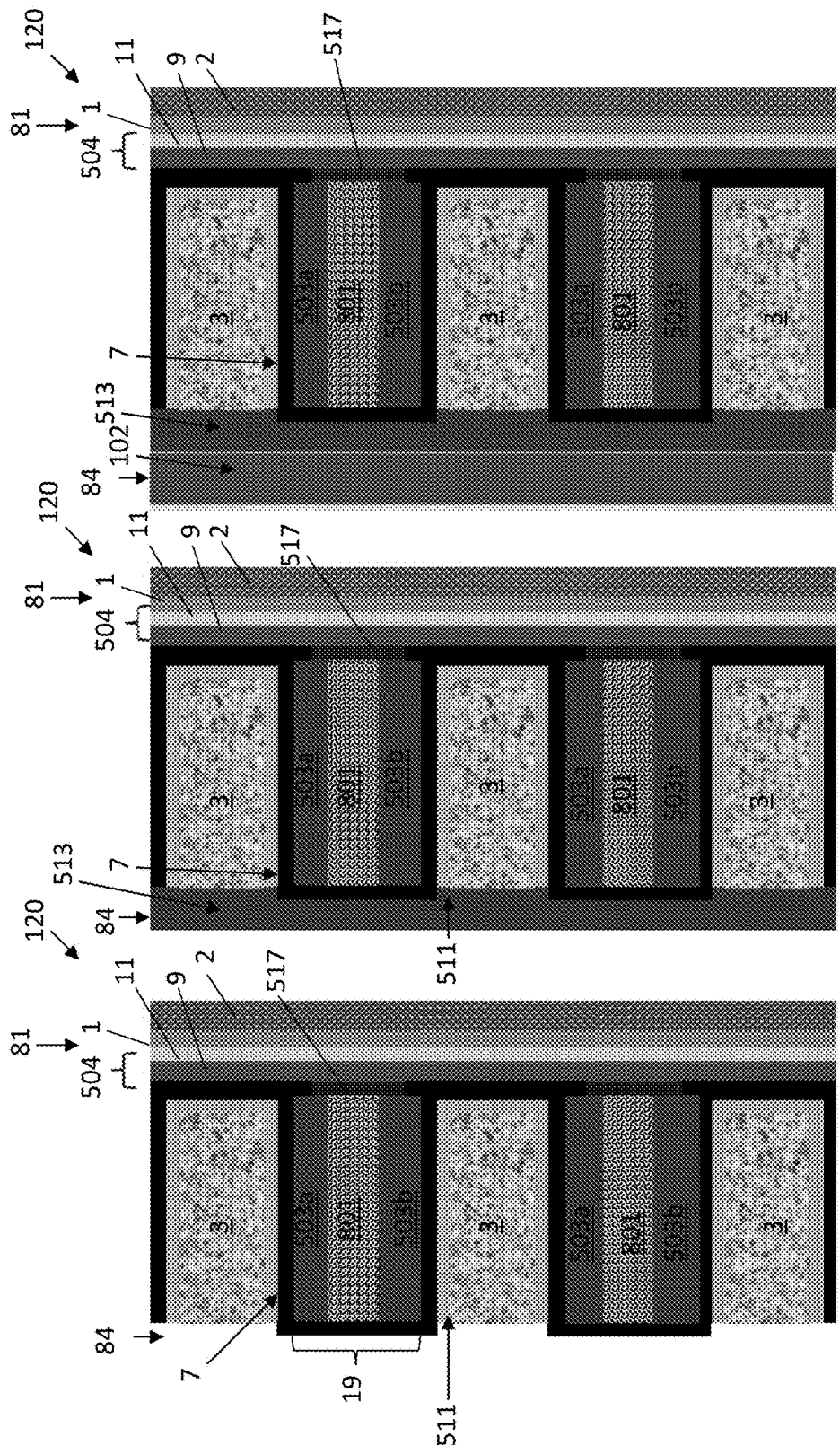

FIG. 8D corresponds to FIG. 5G described above, and illustrates the formation of control gate electrodes 3 over the blocking dielectric 7 in the back side recesses 509 through the back side opening 84. FIGS. 8E and 8F correspond to FIG. 5I described above, and illustrate the formation of a layer of insulating material 513 on the sidewall 511 of the back side opening 84 (FIG. 8E), and the formation of a source side electrode 102 (i.e., source line) comprising an electrically conductive material within the back side opening 84 (FIG. 8F).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of making a monolithic three dimensional NAND string, comprising:
    forming a stack of alternating first material layers and second material layers over a major surface of a substrate, wherein each of the second material layers comprises a layer of a first silicon oxide material between two layers of a second silicon oxide material different from the first silicon oxide material, and the first material layers comprise a material that is different than the first silicon oxide material and the second silicon oxide material;
    etching the stack to form a front side opening in the stack;
    forming a cover layer of an insulating material over the sidewall of the front side opening in the stack;
    forming at least a portion of a memory film over a sidewall of the cover layer within the front side opening;
    forming a semiconductor channel in the front side opening such that at least a portion of the memory film is located between the semiconductor channel and the sidewall of the front side opening;
    etching through the stack to form a back side opening in the stack;
    forming first backside recesses by removing first material layers and portions of the cover layer at each level of the first material layers selective to the second material layers by introducing an etchant through the back side opening;
    forming electrically conductive layers in the first back side recesses;
    removing each layer of the first silicon oxide material selective to remaining discrete segments of the cover layer and the layers of the second silicon oxide material to form second back side recesses after formation of the electrically conductive layers in the first back side recesses; and
    depositing an additional insulating material over a sidewall of the back side opening to enclose the second back side recesses each of which is present between respective two layers of second silicon oxide material,
    wherein an air gap is formed between the respective two layers of second silicon oxide material in each of the second back side recesses, and a vertical sidewall of a respective one of the remaining discrete segments of the cover layer is physically exposed to the air gap after depositing the additional insulating material over the sidewall of the back side opening.

2. The method of claim 1, wherein the second backside recesses are formed by an etch process that employs an etching medium, and wherein the first silicon oxide material has a higher etch rate than the second silicon oxide material when exposed to the etching medium.

3. The method of claim 2, wherein the first silicon oxide material is etched through the back side opening to remove all of the first silicon oxide material from the back side recesses, stopping the etch at the remaining discrete segment of the cover layer.

4. The method of claim 2, wherein first silicon oxide material is doped with at least one of boron and phosphorus.

5. The method of claim 2, wherein the first silicon oxide material is deposited by CVD using a dichlorosilane ($H_2SiCl_2$) source, and the second silicon oxide material is deposited by CVD using a disilane ($Si_2H_6$) source.

6. The method of claim 2, wherein the first silicon oxide material is deposited by High Aspect Ratio Process (HARP) non-plasma based CVD using TEOS and ozone sources and the second silicon oxide material is deposited by high density plasma (HDP) CVD.

7. The method of claim 2, wherein the first silicon oxide material comprises borosilicate glass or borophosphosilicate glass, and the second silicon oxide material is deposited using a TEOS source.

8. The method of claim 1, wherein the memory film comprises at least one charge storage region and a tunnel dielectric extending over the sidewall of the front side opening, wherein the tunnel dielectric is located between the at least one charge storage region and the semiconductor channel.

9. The method of claim 1, further comprising forming one of a source or drain electrode which contacts the semiconductor channel from above, and another one of a source or drain electrode which contacts the semiconductor channel below the stack to form the monolithic three dimensional NAND string.

10. The method of claim 1, wherein:
the semiconductor channel has a U-shaped side cross section;
two wing portions of the U-shaped semiconductor channel extend substantially perpendicular to a major surface of the substrate are connected by a connecting portion which extends substantially parallel to the major surface of the substrate;
one of a source or drain electrode contacts the first wing portion of the semiconductor channel from above; and
another one of a source or drain electrode contacts the second wing portion of the semiconductor channel from above.

11. The method of claim 1, wherein the cover layer is vertically recessed from volumes from which the first material layers are removed during formation of the first back side recesses to provide void areas between a subset of the layers of the second silicon oxide material and the memory film.

12. The method of claim 11, wherein each remaining portion of the cover layer after formation of the first back side recesses contacts sidewalls of a pair of second silicon oxide layers and contacts the first silicon oxide layer.

13. The method of claim 11, wherein a plurality of second silicon oxide layers includes a respective sidewall that includes a first portion that is physically exposed to a respective void area and a second portion that contacts a respective remaining portion of the cover layer.

14. The method of claim 11, further comprising depositing a blocking dielectric into the void areas, on physically exposed surfaces of the memory film, and on physically exposed horizontal surfaces of the second silicon oxide layer, wherein the electrically conductive layers are formed on the blocking dielectric.

15. The method of claim 14, wherein the blocking dielectric includes vertically protruding portions that contact a sidewall of a respective second silicon oxide layer and a respective portion of a sidewall of the memory film.

16. The method of claim 1, wherein the cover layer comprises silicon oxide.

17. The method of claim 1, wherein the first material layers comprise a material selected from silicon nitride and polysilicon.

18. The method of claim 1, wherein the remaining discrete segments of the cover layer form vertically spaced-apart segments of the insulating material contacting a respective layer of the first silicon oxide material within each second material layer.

19. The method of claim 18, wherein the electrically conductive layers are formed between vertically neighboring pairs of the second material layers while each of the second material layers includes a respective layer of the first silicon oxide material and a respective pair of layers of the second silicon oxide material.

20. A method of making a monolithic three dimensional NAND string, comprising:
forming a stack of alternating first material layers and second material layers over a major surface of a substrate, wherein each of the second material layers comprises a layer of a first silicon oxide material between two layers of a second silicon oxide material different from the first silicon oxide material, and the first material layers comprise a material that is different than the first silicon oxide material and the second silicon oxide material;
etching the stack to form a front side opening in the stack;
forming a cover layer of an insulating material over the sidewall of the front side opening in the stack;
forming at least a portion of a memory film over a sidewall of the cover layer within the front side opening;
forming a semiconductor channel in the front side opening such that at least a portion of the memory film is located between the semiconductor channel and the sidewall of the front side opening;
etching through the stack to form a back side opening in the stack;
forming first backside recesses by removing first material layers and portions of the cover layer at each level of the first material layers selective to the second material layers by introducing an etchant through the back side opening, wherein remaining portions of the cover layer form vertically spaced-apart segments of the insulating material contacting a respective layer of the first silicon oxide material within each second material layer;
forming electrically conductive layers in the first back side recesses between vertically neighboring pairs of the second material layers while each of the second material layers includes a respective layer of the first silicon oxide material and a respective pair of layers of the second silicon oxide material;
removing each layer of the first silicon oxide material selective to the layers of the second silicon oxide material to form second back side recesses while the vertically spaced-apart segments of the insulating material are present; and
depositing an additional insulating material over a sidewall of the back side opening to enclose the second back side recesses each of which is present between respective two layers of second silicon oxide material,
wherein an air gap is formed between the respective two layers of second silicon oxide material in each of the second back side recesses, and a vertical sidewall of a respective one of the vertically spaced-apart segments of the insulating material is physically exposed to the air gap after depositing the additional insulating material over the sidewall of the back side opening.

21. The method of claim 20, wherein a sidewall of a respective vertically spaced-apart segment of the insulating material is physically exposed within each second back side recess upon formation of the second back side recesses.

22. The method of claim 20, wherein the second backside recesses are formed by an etch process that employs an etching medium, and wherein the first silicon oxide material has a higher etch rate than the second silicon oxide material when exposed to the etching medium.

23. The method of claim 20, wherein the first silicon oxide material is etched through the back side opening to remove all of the first silicon oxide material from the back side recesses, stopping the etch at the vertically spaced-apart segments of the insulating material.

24. The method of claim 20, wherein first silicon oxide material is doped with at least one of boron and phosphorus.

25. The method of claim 20, wherein the first silicon oxide material is deposited by CVD using a dichlorosilane ($H_2SiCl_2$) source, and the second silicon oxide material is deposited by CVD using a disilane ($Si_2H_6$) source.

26. The method of claim 20, wherein the first silicon oxide material is deposited by High Aspect Ratio Process (HARP) non-plasma based CVD using TEOS and ozone sources and the second silicon oxide material is deposited by high density plasma (HDP) CVD.

27. The method of claim 20, wherein the first silicon oxide material comprises borosilicate glass or borophosphosilicate glass, and the second silicon oxide material is deposited using a TEOS source.

28. The method of claim 20, wherein the memory film comprises at least one charge storage region and a tunnel dielectric extending over the sidewall of the front side opening, wherein the tunnel dielectric is located between the at least one charge storage region and the semiconductor channel.

29. The method of claim 20, further comprising forming one of a source or drain electrode which contacts the semiconductor channel from above, and another one of a source or drain electrode which contacts the semiconductor channel below the stack to form the monolithic three dimensional NAND string.

30. The method of claim 20, wherein:
the semiconductor channel has a U-shaped side cross section;
two wing portions of the U-shaped semiconductor channel extend substantially perpendicular to a major surface of the substrate are connected by a connecting portion which extends substantially parallel to the major surface of the substrate;
one of a source or drain electrode contacts the first wing portion of the semiconductor channel from above; and
another one of a source or drain electrode contacts the second wing portion of the semiconductor channel from above.

31. The method of claim 20, wherein the cover layer is vertically recessed from volumes from which the first material layers are removed during formation of the first back side recesses to provide void areas between a subset of the layers of the second silicon oxide material and the memory film.

32. The method of claim 31, wherein each remaining portion of the cover layer after formation of the first back side recesses contacts sidewalls of a pair of second silicon oxide layers and contacts the first silicon oxide layer.

33. The method of claim 31, wherein a plurality of second silicon oxide layers includes a respective sidewall that includes a first portion that is physically exposed to a respective void area and a second portion that contacts a respective remaining portion of the cover layer.

34. The method of claim 31, further comprising depositing a blocking dielectric into the void areas, on physically exposed surfaces of the memory film, and on physically exposed horizontal surfaces of the second silicon oxide layer, wherein the electrically conductive layers are formed on the blocking dielectric.

35. The method of claim 34, wherein the blocking dielectric includes vertically protruding portions that contact a sidewall of a respective second silicon oxide layer and a respective portion of a sidewall of the memory film.

36. The method of claim 20, wherein the cover layer comprises silicon oxide.

37. The method of claim 20, wherein the first material layers comprise a material selected from silicon nitride and polysilicon.

38. The method of claim 1, wherein the vertical sidewall of a respective remaining discrete segment of the cover layer is physically exposed within each second back side recess upon formation of the second back side recesses.

39. The method of claim 14, wherein the blocking dielectric is deposited directly on top surfaces and bottom surfaces of the remaining discrete segments of the cover layer at each level of the first material layers after removal of the first material layers.

40. The method of claim 39, wherein the blocking dielectric is deposited directly on portions of an outer sidewall of the memory film.

41. The method of claim 34, wherein the blocking dielectric is formed directly on top surfaces and bottom surfaces of the vertically spaced-apart segments of the insulating material at each level of the first material layers after removal of the first material layers.

42. The method of claim 41, wherein the blocking dielectric is deposited directly on portions of an outer sidewall of the memory film.

* * * * *